United States Patent
Kanakamedala et al.

(10) Patent No.: US 9,893,081 B1
(45) Date of Patent: Feb. 13, 2018

(54) RIDGED WORD LINES FOR INCREASING CONTROL GATE LENGTHS IN A THREE-DIMENSIONAL MEMORY DEVICE

(71) Applicant: SANDISK TECHNOLOGIES LLC, Plano, TX (US)

(72) Inventors: Senaka Kanakamedala, Milpitas, CA (US); Rahul Sharangpani, Fremont, CA (US); Raghuveer S. Makala, Campbell, CA (US); Somesh Peri, San Jose, CA (US); Yao-Sheng Lee, Tampa, FL (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/231,205

(22) Filed: Aug. 8, 2016

(51) Int. Cl.
| | |
|---|---|
| H01L 29/792 | (2006.01) |
| H01L 27/115 | (2017.01) |
| H01L 21/768 | (2006.01) |
| H01L 29/788 | (2006.01) |
| H01L 27/11582 | (2017.01) |
| H01L 27/11573 | (2017.01) |
| H01L 27/11529 | (2017.01) |
| H01L 27/11556 | (2017.01) |
| H01L 23/528 | (2006.01) |

(52) U.S. Cl.
CPC .... *H01L 27/11582* (2013.01); *H01L 23/5283* (2013.01); *H01L 27/11529* (2013.01); *H01L 27/11556* (2013.01); *H01L 27/11573* (2013.01)

(58) Field of Classification Search
CPC .................................................. H01L 29/7926
See application file for complete search history.

(56) References Cited

U.S. PATENT DOCUMENTS

| | | |
|---|---|---|
| 8,349,681 B2 | 1/2013 | Alsmeier et al. |
| 9,230,979 B1 | 1/2016 | Pachamuthu et al. |

(Continued)

OTHER PUBLICATIONS

U.S. Appl. No. 14/804,564, filed Jul. 21, 2015, SanDisk Technologies Inc.

(Continued)

*Primary Examiner* — Su C Kim
*Assistant Examiner* — David S Wilbert
(74) *Attorney, Agent, or Firm* — The Marbury Law Group PLLC

(57) ABSTRACT

After formation of a memory opening through an alternating stack of insulating layers and sacrificial material layers, a blocking dielectric having a greater thickness at levels of the insulating layers than at levels of the sacrificial material layers is formed around, or within, the memory opening. A memory stack structure is formed within the memory opening. Backside recesses are formed by removing the sacrificial material layers and surface portions of the blocking dielectric to form backside recesses including vertically expanded end portions. Electrically conductive layers are formed within the backside recesses. Each of the electrically conductive layers is a control gate electrode which includes a uniform thickness portion and a ridged end portion having a greater vertical extent than the uniform thickness region. The ridged end portion laterally surrounds the memory stack structure and provides a longer gate length for the control gate electrodes for the memory stack structure.

14 Claims, 24 Drawing Sheets

(56) References Cited

U.S. PATENT DOCUMENTS

| | | |
|---|---|---|
| 9,236,396 B1 | 1/2016 | Koka et al. |
| 9,305,849 B1 | 4/2016 | Tsutsumi et al. |
| 9,305,932 B2 | 4/2016 | Kanakamedala et al. |
| 9,305,937 B1 | 4/2016 | Tsutsumi et al. |
| 9,379,132 B2 | 6/2016 | Koka et al. |
| 2011/0147824 A1* | 6/2011 | Son .................. G11C 16/0483 257/324 |
| 2014/0273373 A1* | 9/2014 | Makala ............. H01L 27/11582 438/270 |
| 2015/0371709 A1 | 12/2015 | Kai et al. |
| 2016/0035742 A1 | 2/2016 | Kanakamedala et al. |
| 2016/0064532 A1 | 3/2016 | Makala et al. |
| 2016/0086972 A1 | 3/2016 | Zhang et al. |
| 2016/0172366 A1 | 6/2016 | Koka et al. |
| 2016/0172370 A1 | 6/2016 | Makala et al. |
| 2016/0211272 A1 | 7/2016 | Koka et al. |

OTHER PUBLICATIONS

U.S. Appl. No. 14/921,385, filed Oct. 23, 2015, SanDisk Technologies Inc.

* cited by examiner

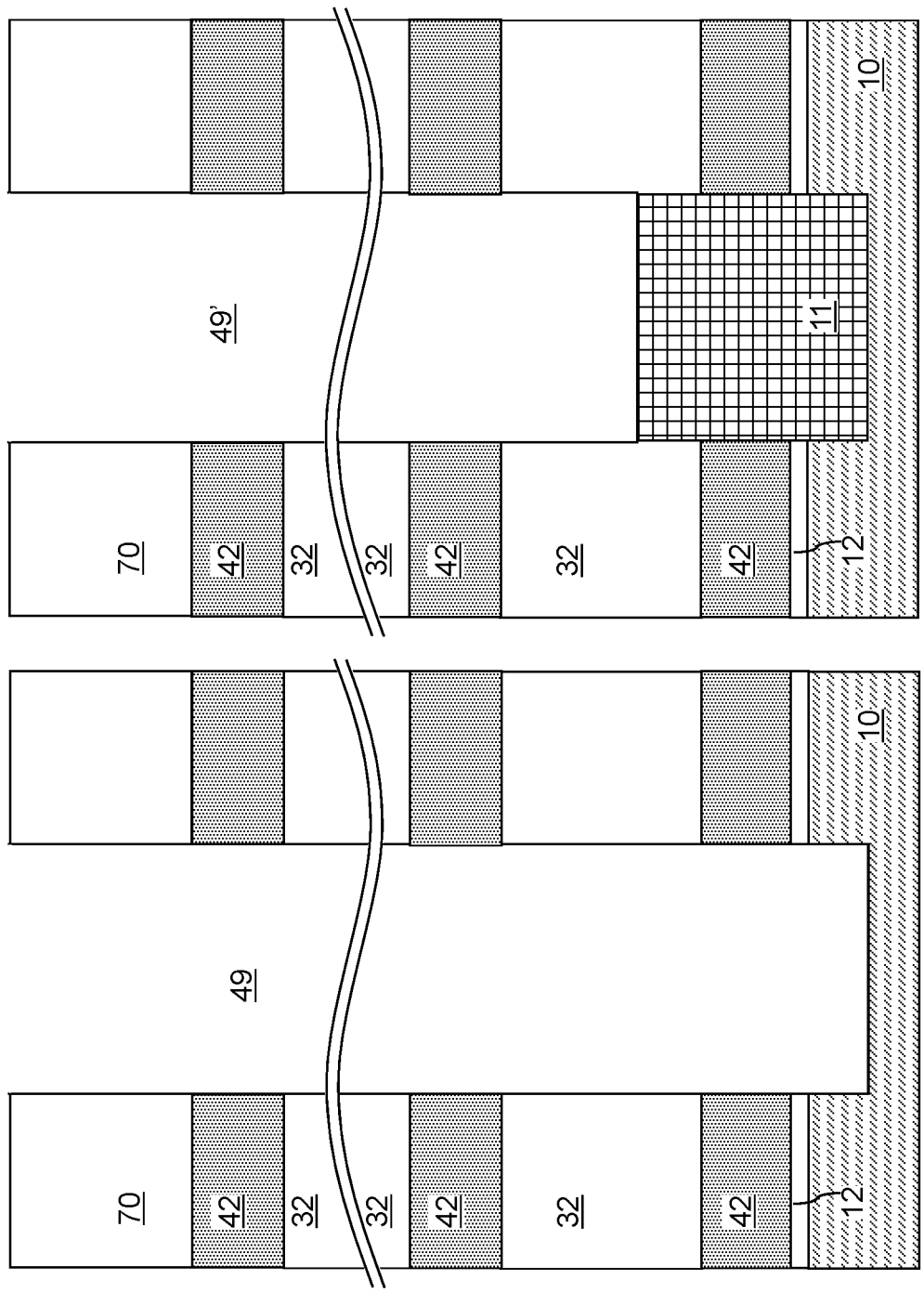

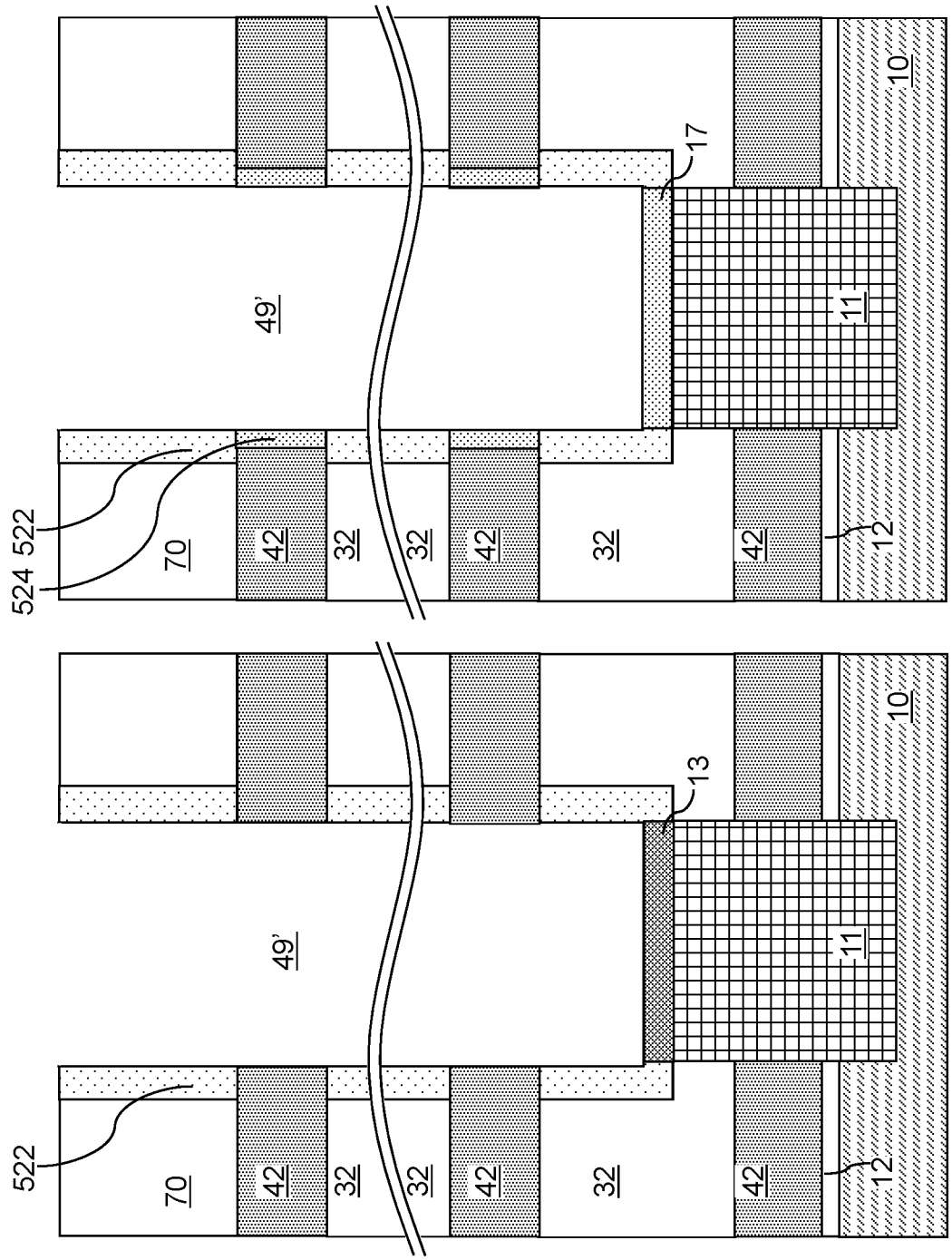

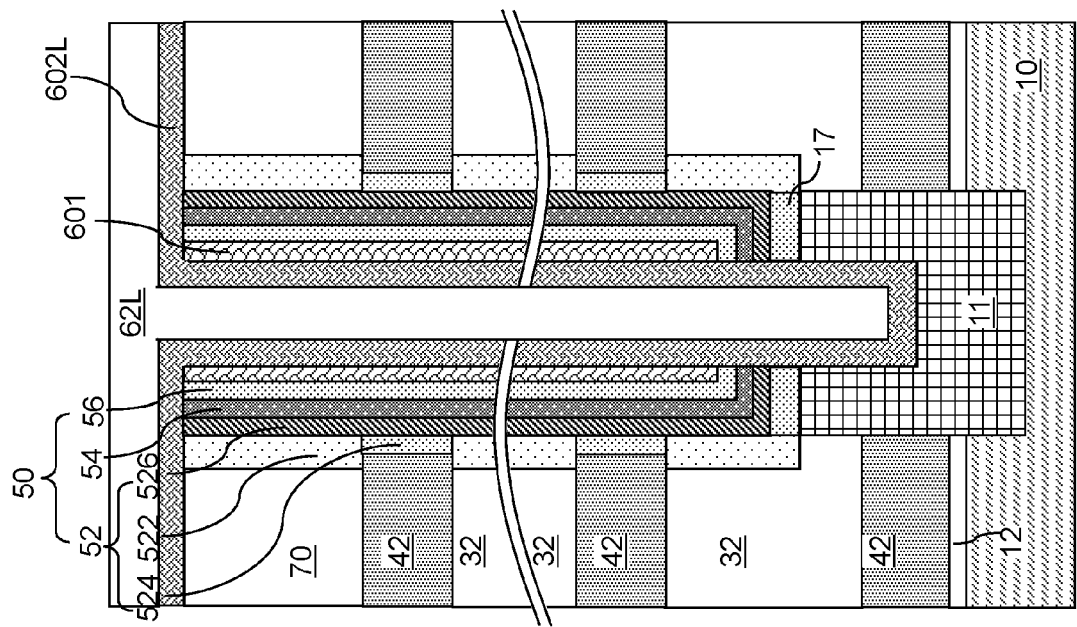
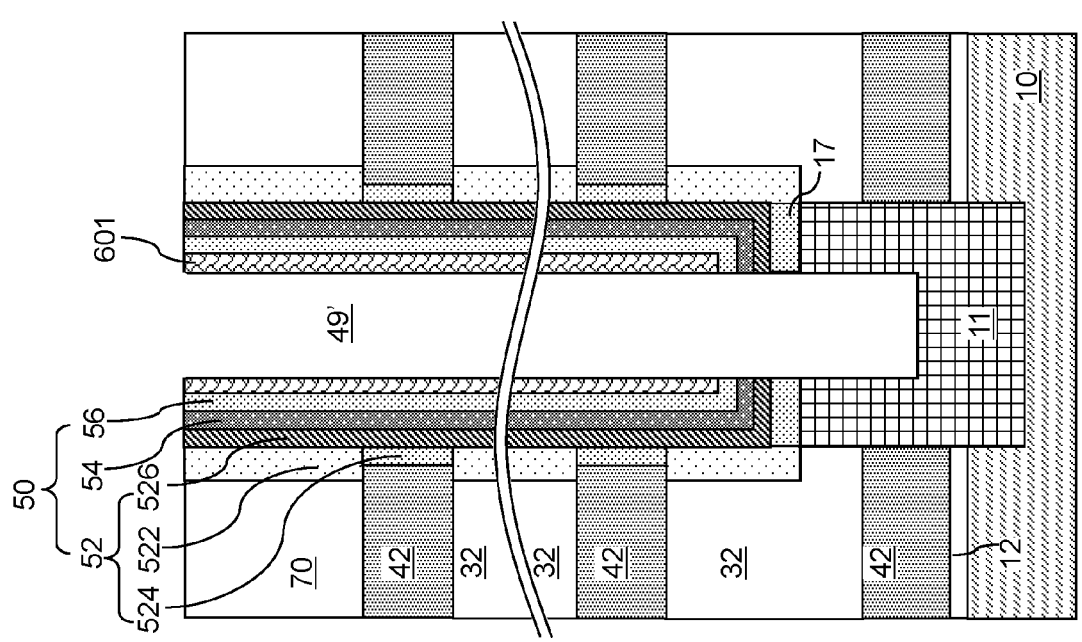
FIG. 5F
FIG. 5E

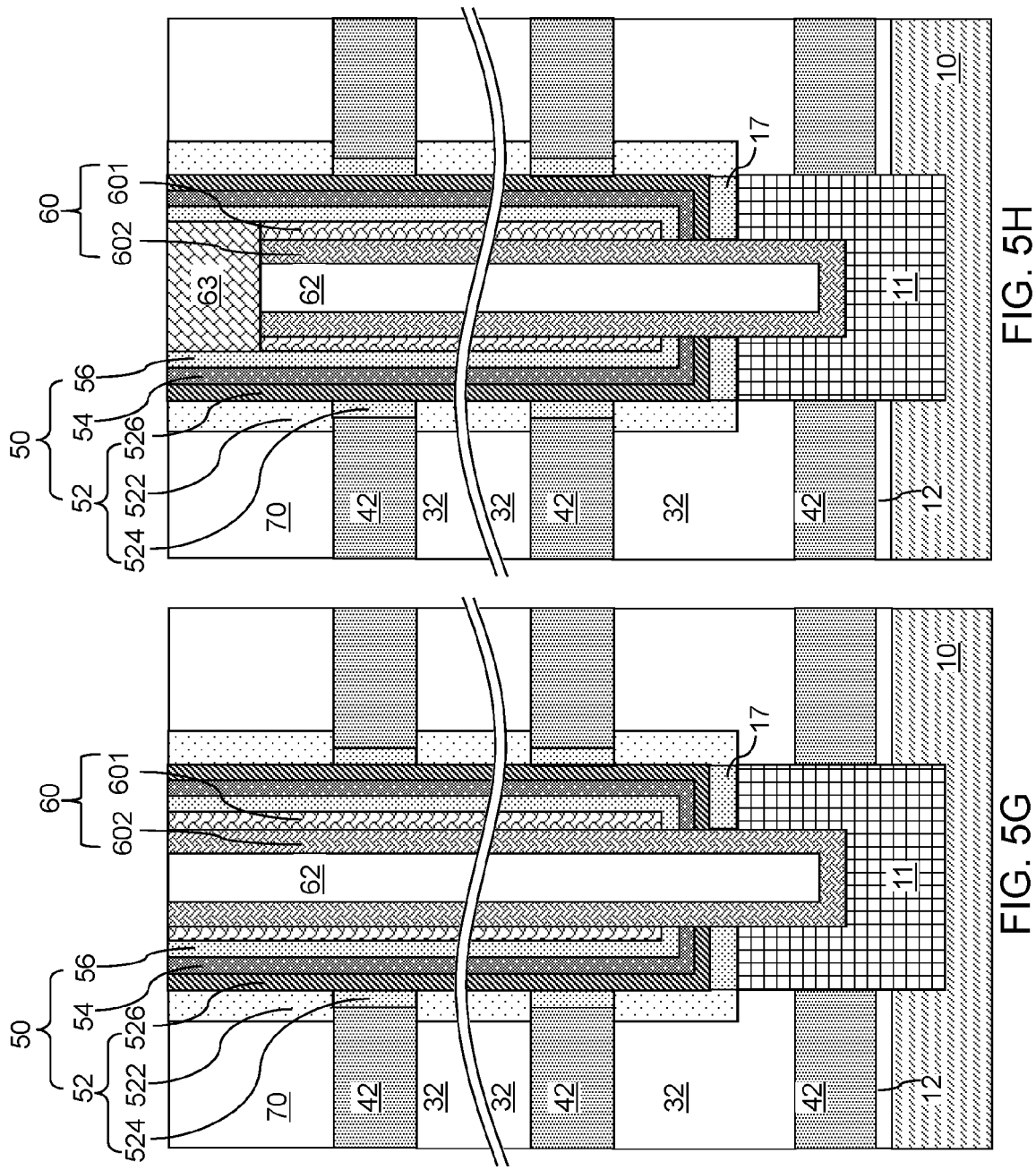

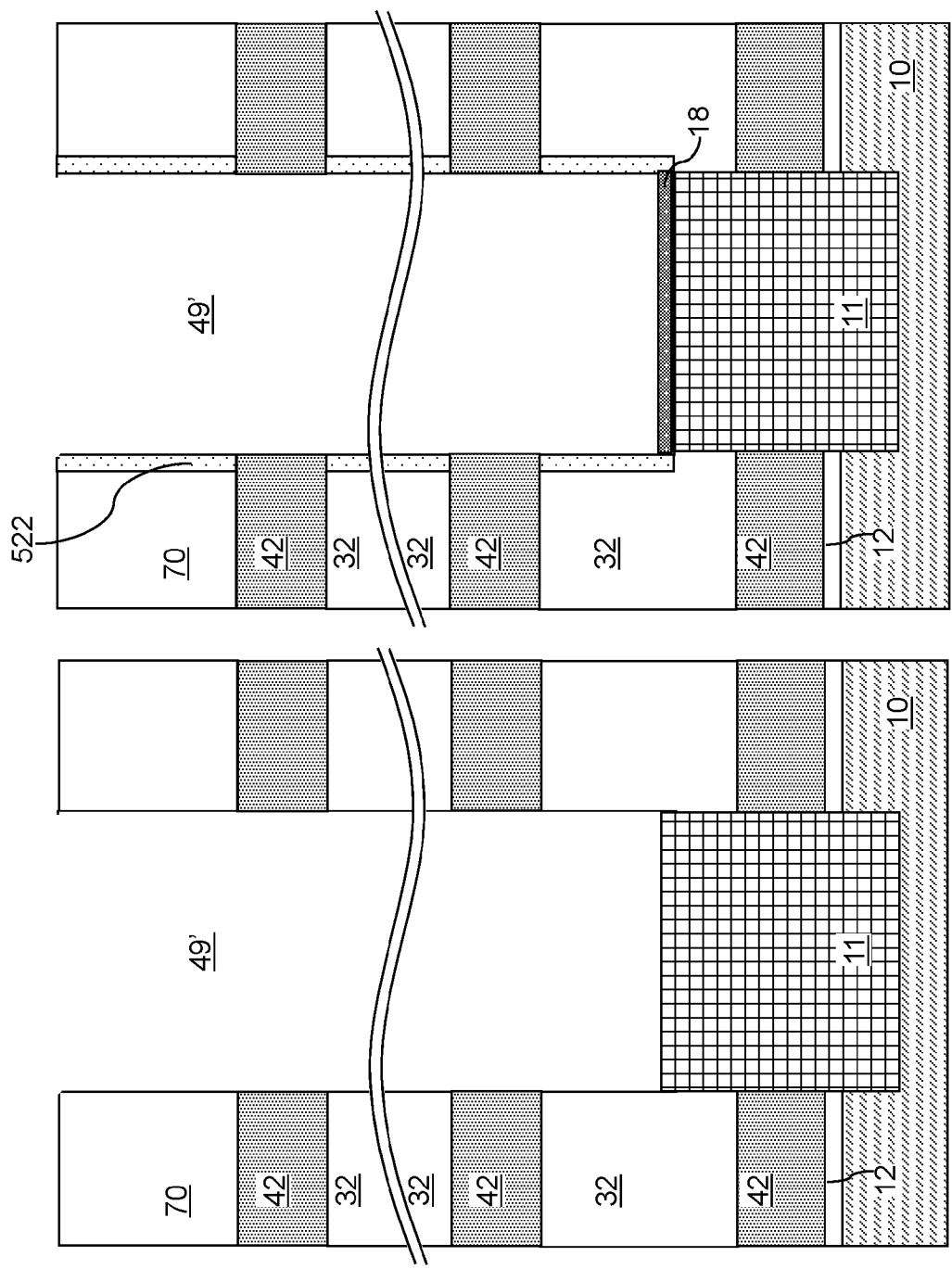

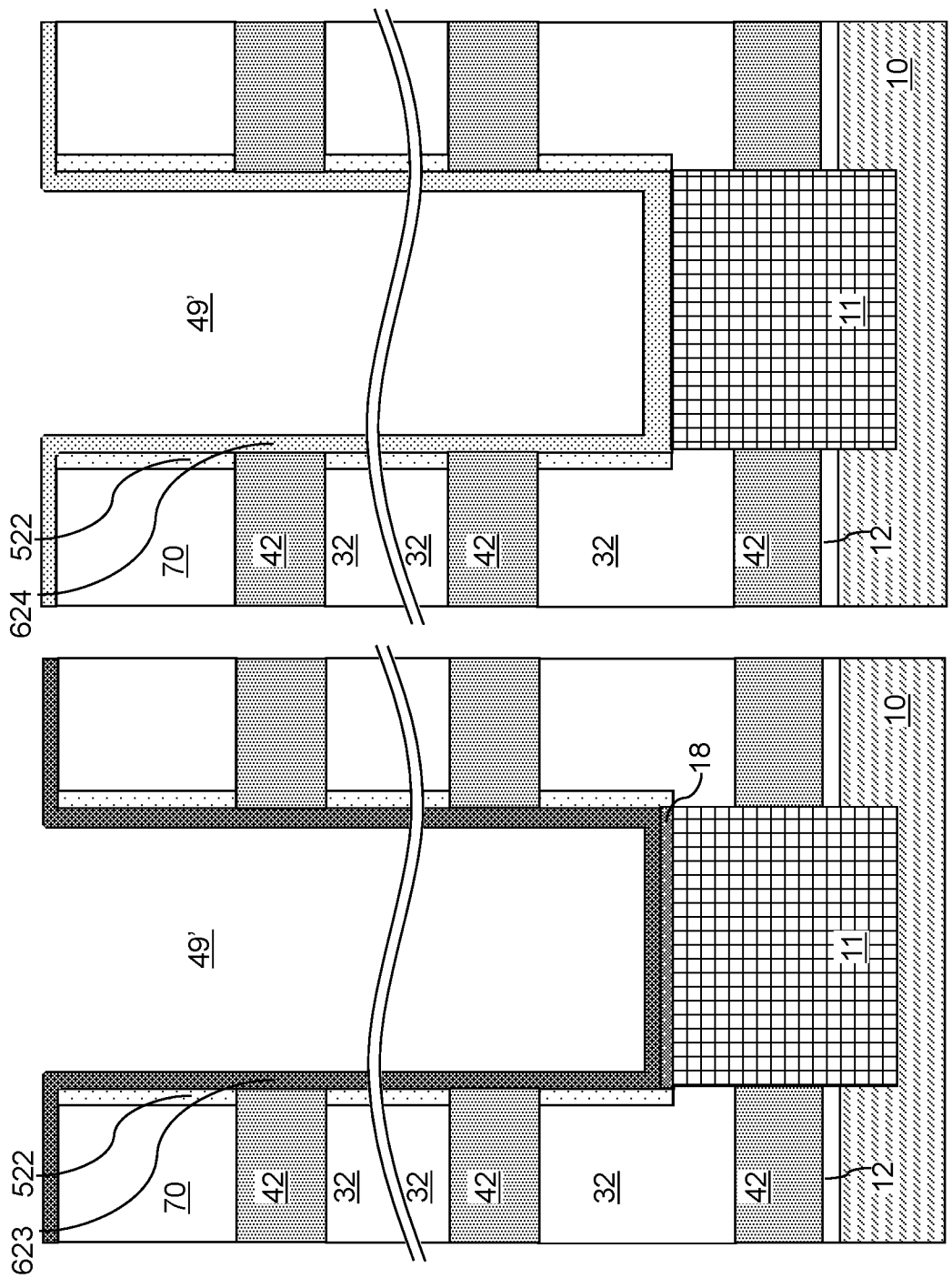

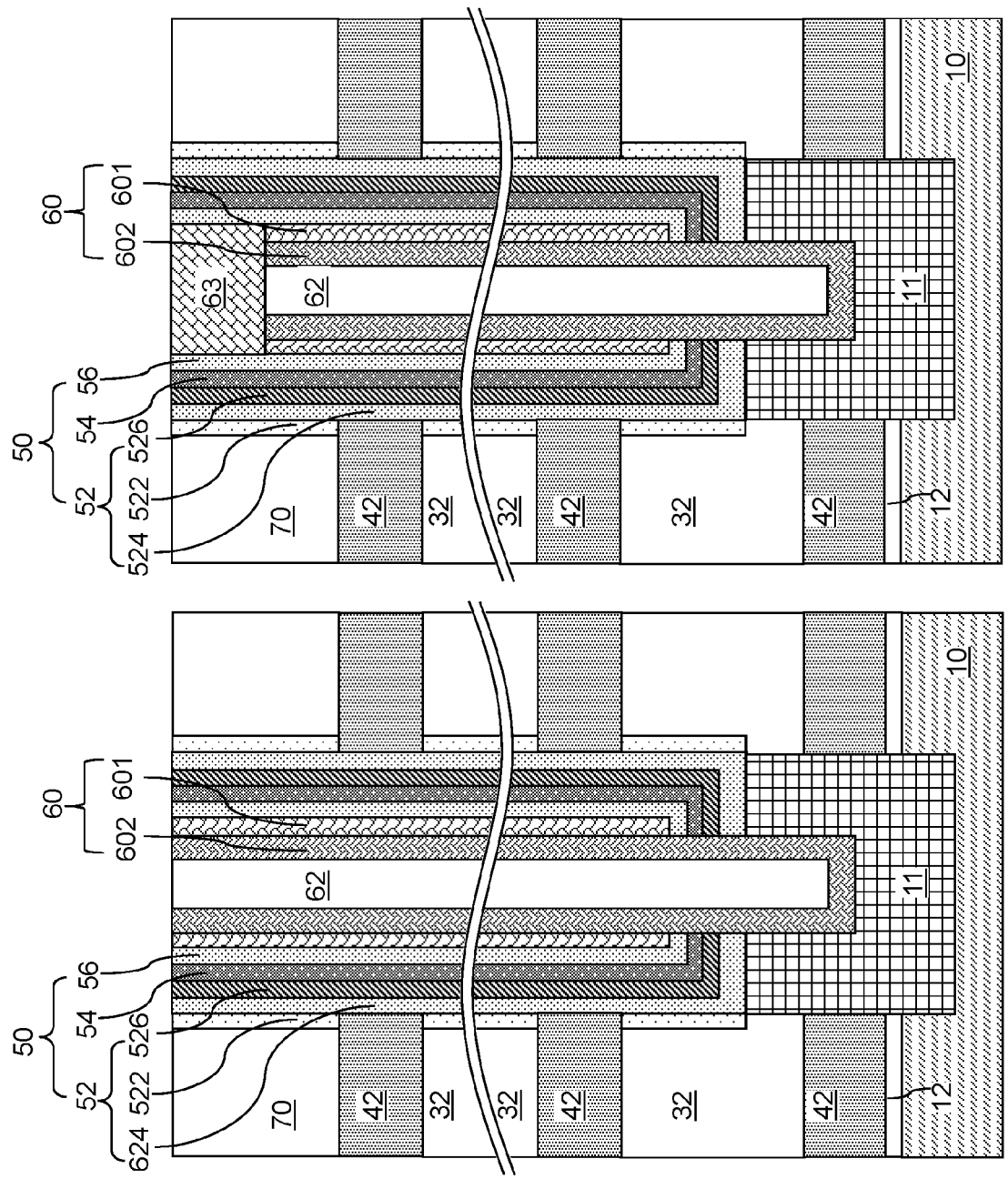

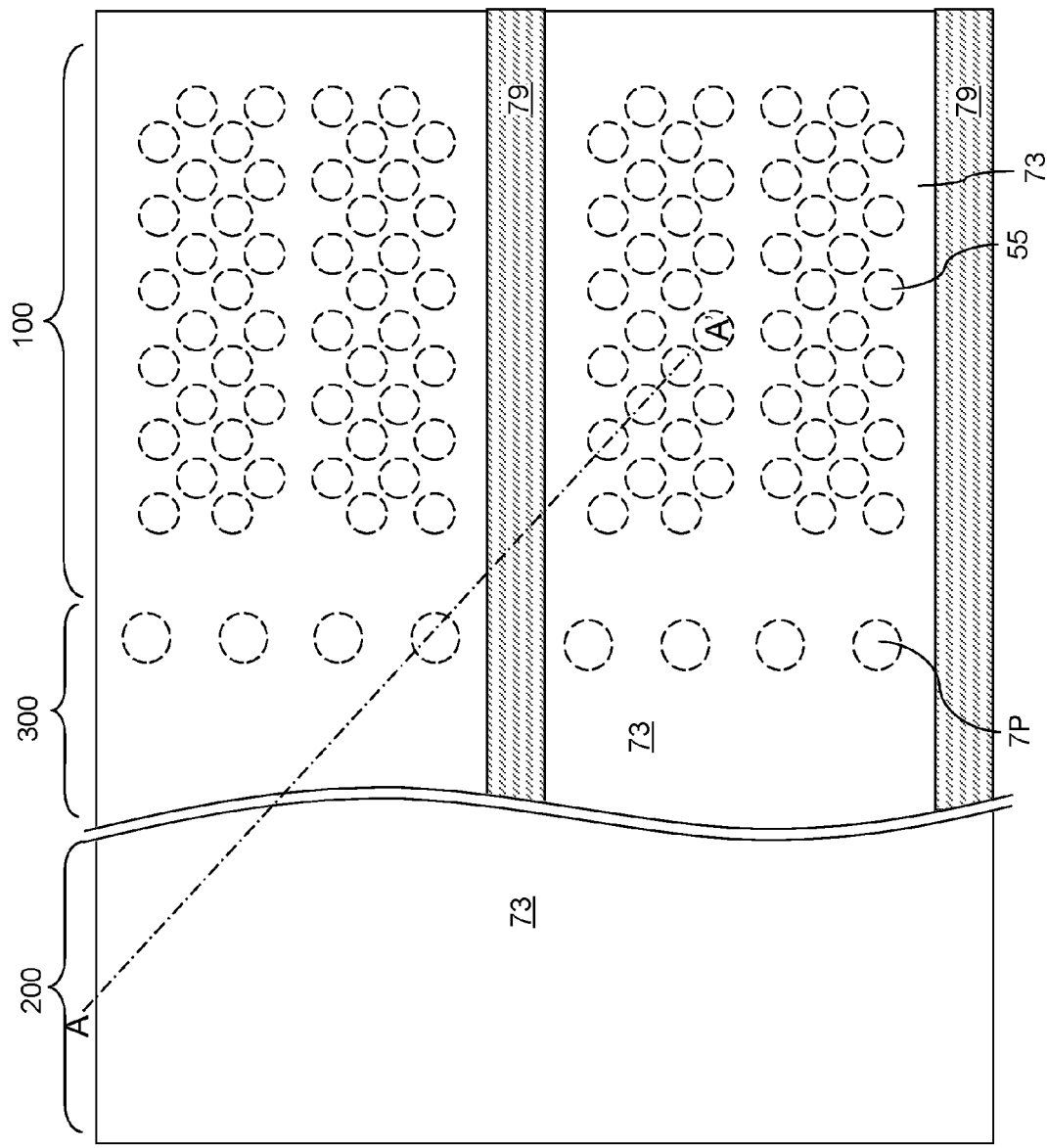

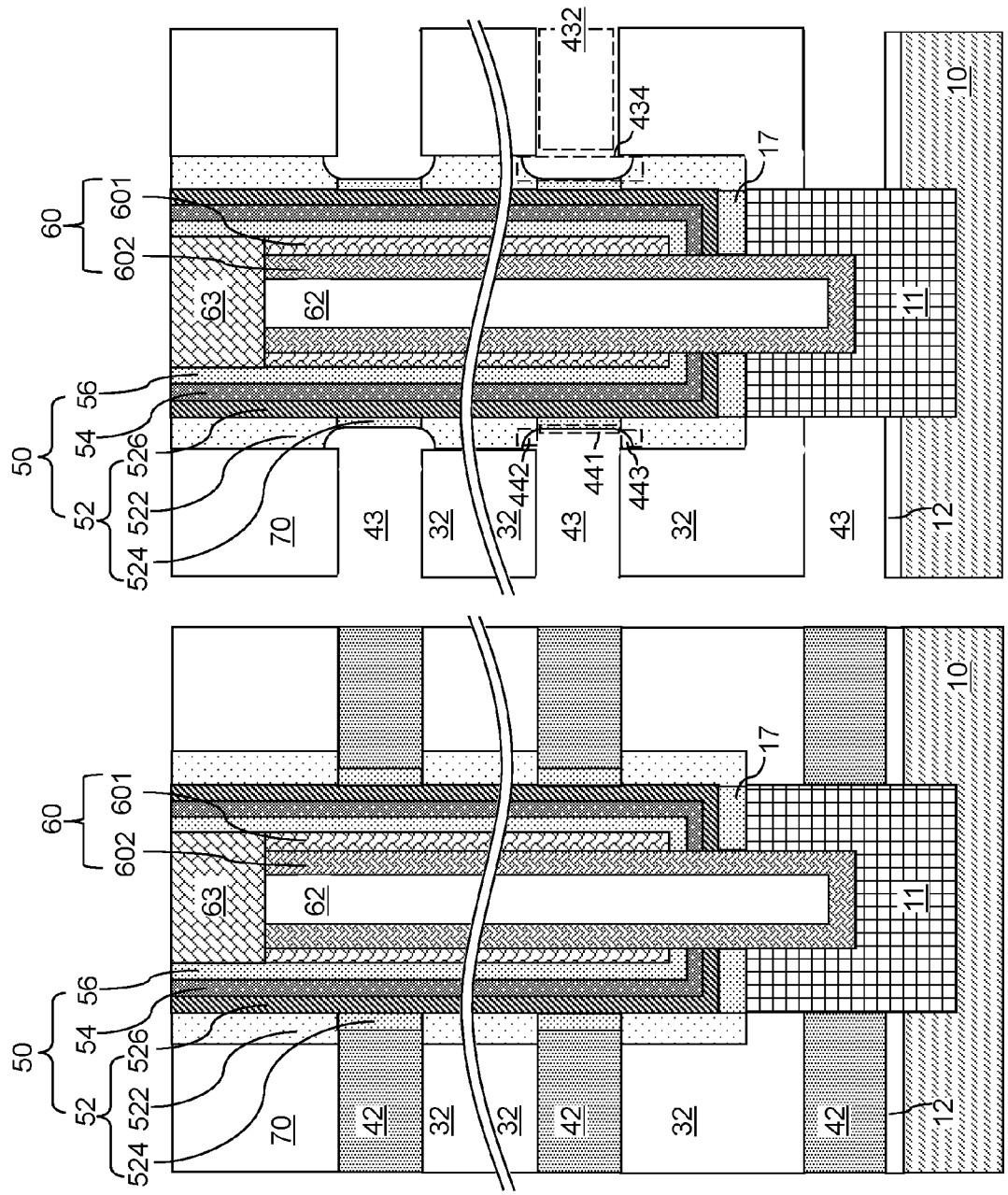

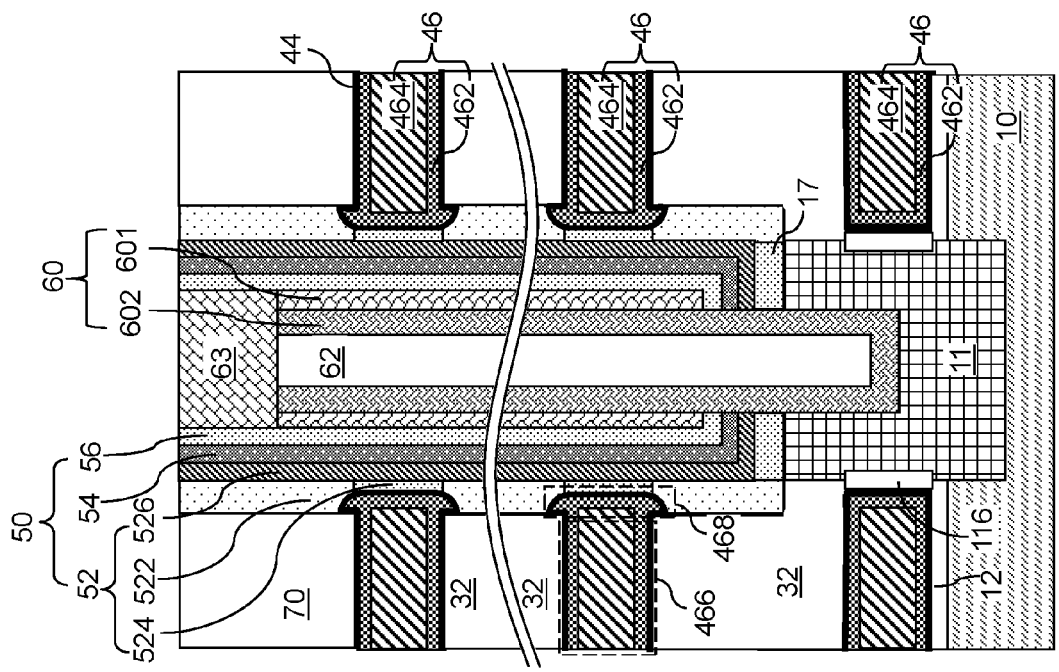
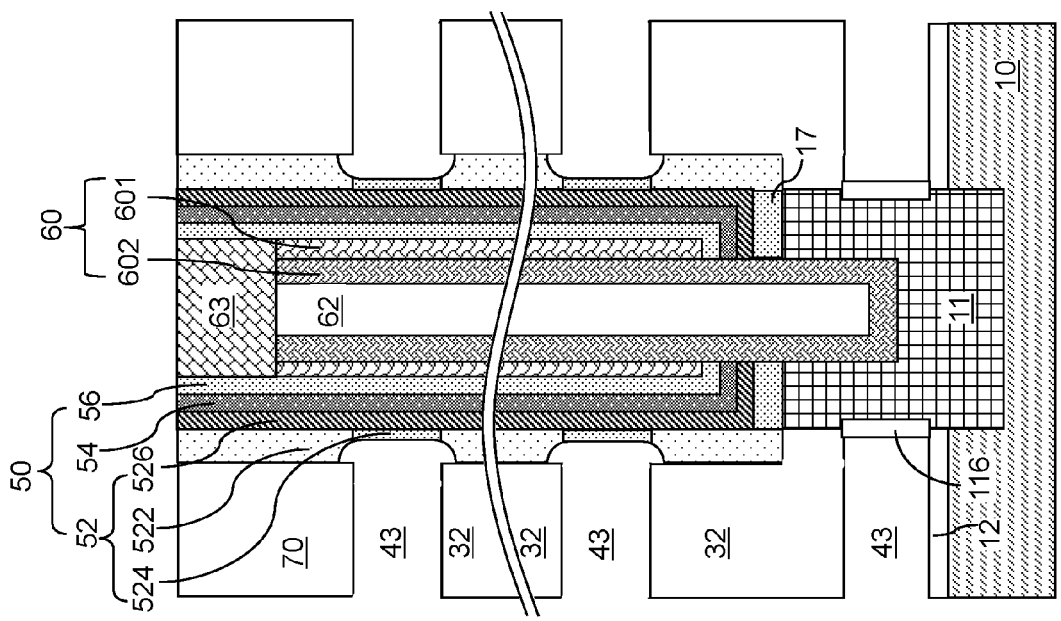
FIG. 10D
FIG. 10C

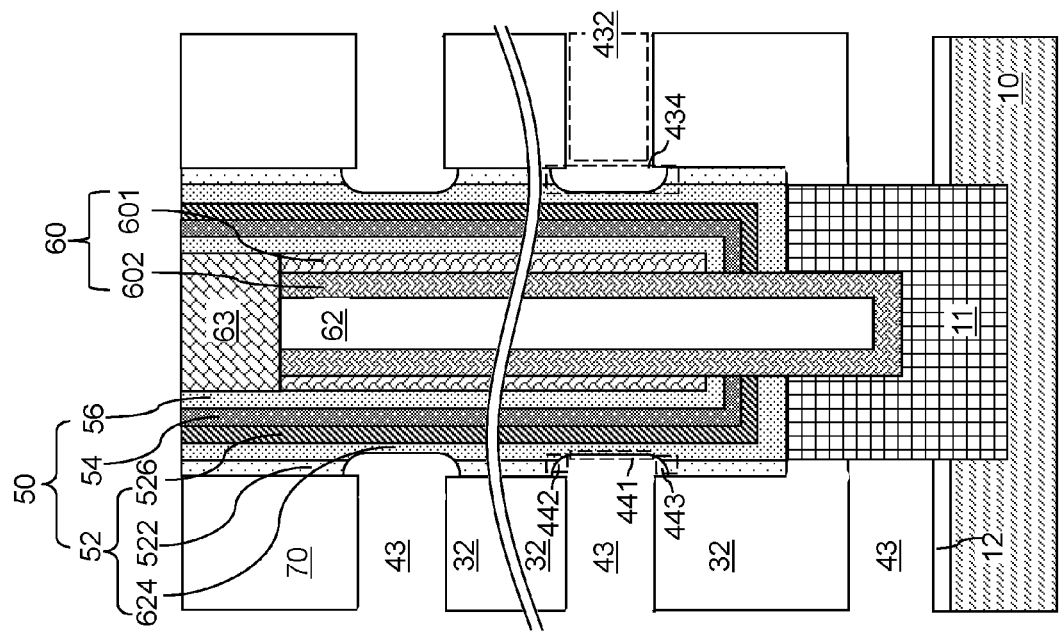
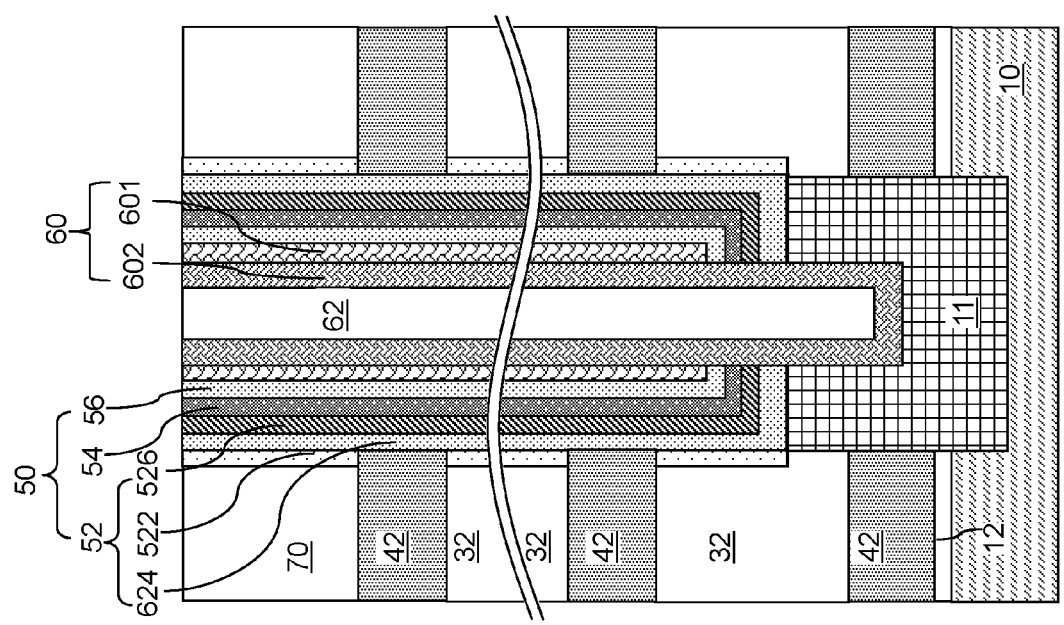
FIG. 11A
FIG. 11B

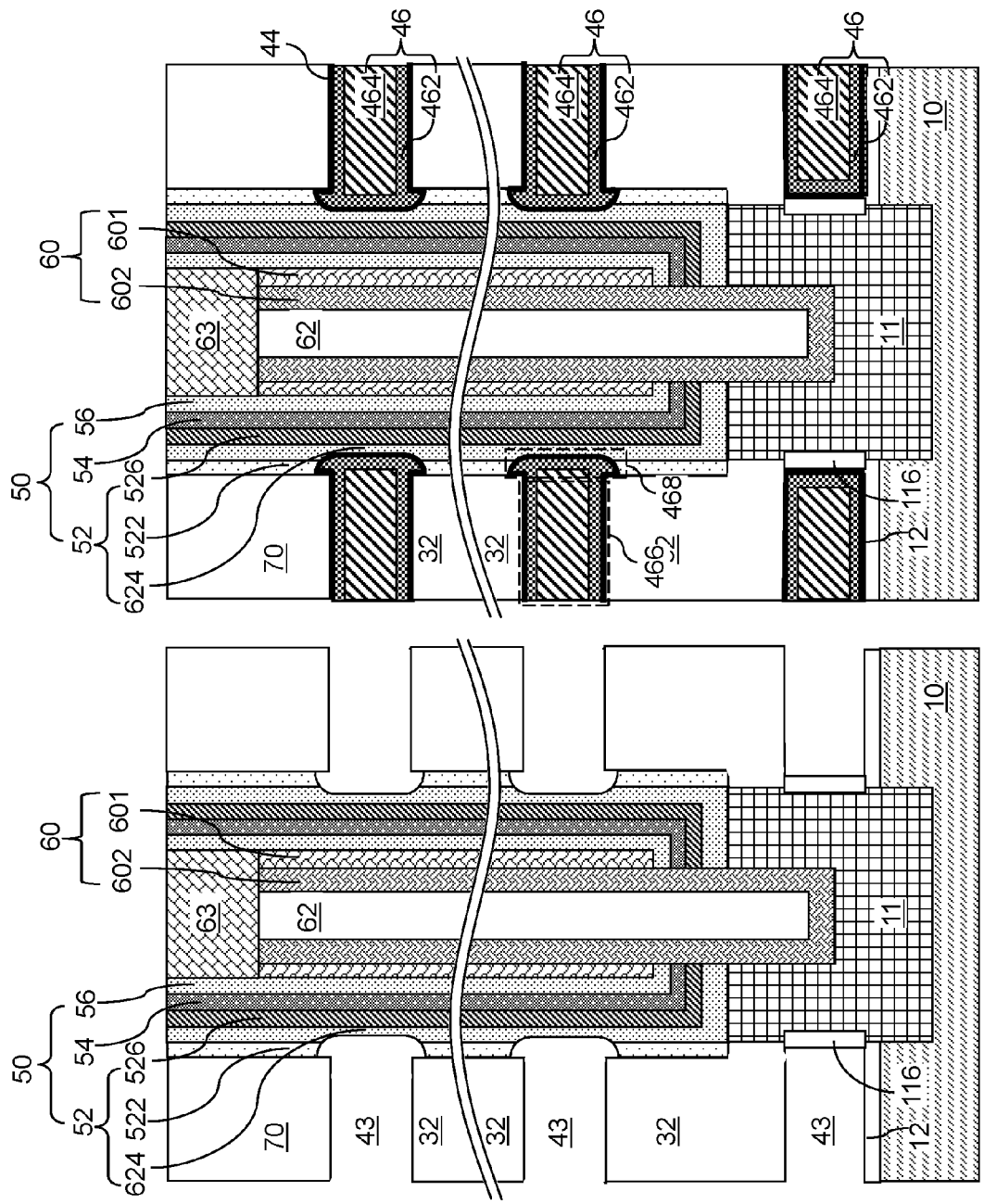

RIDGED WORD LINES FOR INCREASING CONTROL GATE LENGTHS IN A THREE-DIMENSIONAL MEMORY DEVICE

FIELD

The present disclosure relates generally to the field of semiconductor devices, and particular to a three-dimensional memory device employing ridged word lines that provide elongated control gate lengths and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and a memory stack structure extending through the alternating stack and comprising a blocking dielectric, a tunneling dielectric, and a vertical semiconductor channel. Each electrically conductive layer within a subset of the electrically conductive layers comprises a control gate electrode having a uniform thickness portion and a ridged end portion. The uniform thickness portion is located farther away from the vertical semiconductor channel than the ridged end portion. The ridged end portion includes an upper ridge that protrudes above a first horizontal plane including a top surface of the uniform thickness portion and a lower ridge that protrudes below a second horizontal plane including a bottom surface of the uniform thickness portion.

According to another aspect of the present disclosure, a method of forming a three-dimensional memory device is provided. An alternating stack of insulating layers and sacrificial material layers is formed over a substrate. A memory opening is formed through the alternating stack. A blocking dielectric having a greater thickness at levels of the insulating layers than at levels of the sacrificial material layers is formed around, or within, the memory opening. A tunneling dielectric and a vertical semiconductor channel are formed within the blocking dielectric. A backside trench is formed through the alternating stack. Backside recesses are formed by removing the sacrificial material layers and surface portions of the blocking dielectric, wherein backside recesses including vertically expanded end portions are formed. Electrically conductive layers are formed within the backside recesses. Each of the electrically conductive layers comprises a uniform thickness portion and a ridged end portion.

BRIEF DESCRIPTION OF THE DRAWINGS

FIGS. 5A-5H are sequential schematic vertical cross-sectional views of a memory opening within the exemplary structure during various processing steps employed to form a first exemplary memory stack structure according to a first embodiment of the present disclosure.

FIGS. 6A-6H are sequential schematic vertical cross-sectional views of a memory opening within the exemplary structure during various processing steps employed to form a second exemplary memory stack structure according to a second embodiment of the present disclosure.

FIG. 8B is a partial see-through top-down view of the exemplary structure of FIG. 8A. The vertical plane A-A' is the plane of the schematic vertical cross-sectional view of FIG. 8A.

FIG. 10A-10D are sequential vertical cross-sectional views around a memory opening within the exemplary structure during various processing steps employed to form electrically conductive layers according to the first embodiment of the present disclosure.

FIG. 11A-11D are sequential vertical cross-sectional views around a memory opening within the exemplary structure during various processing steps employed to form electrically conductive layers according to the second embodiment of the present disclosure.

DETAILED DESCRIPTION

Figure 1:
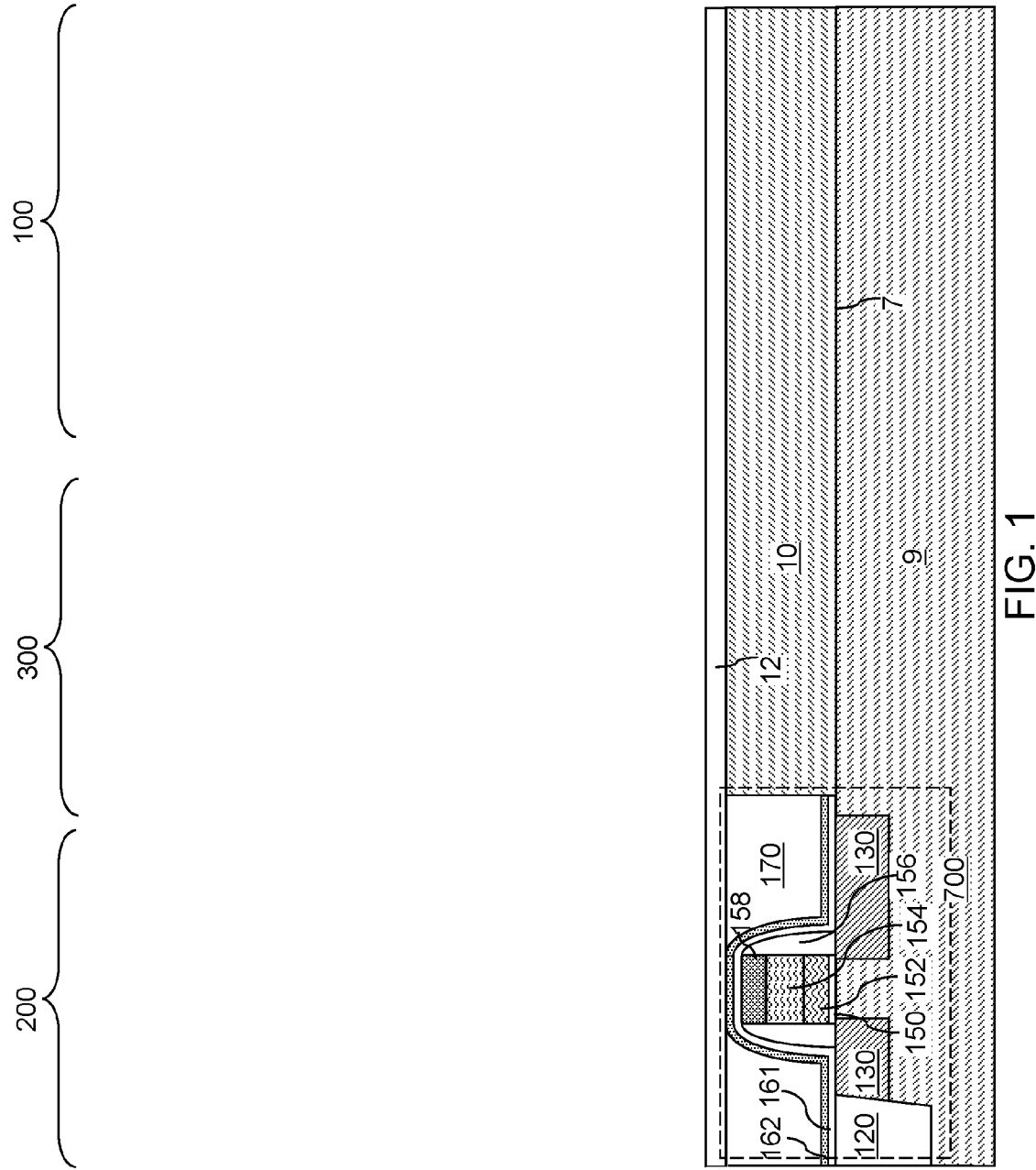
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
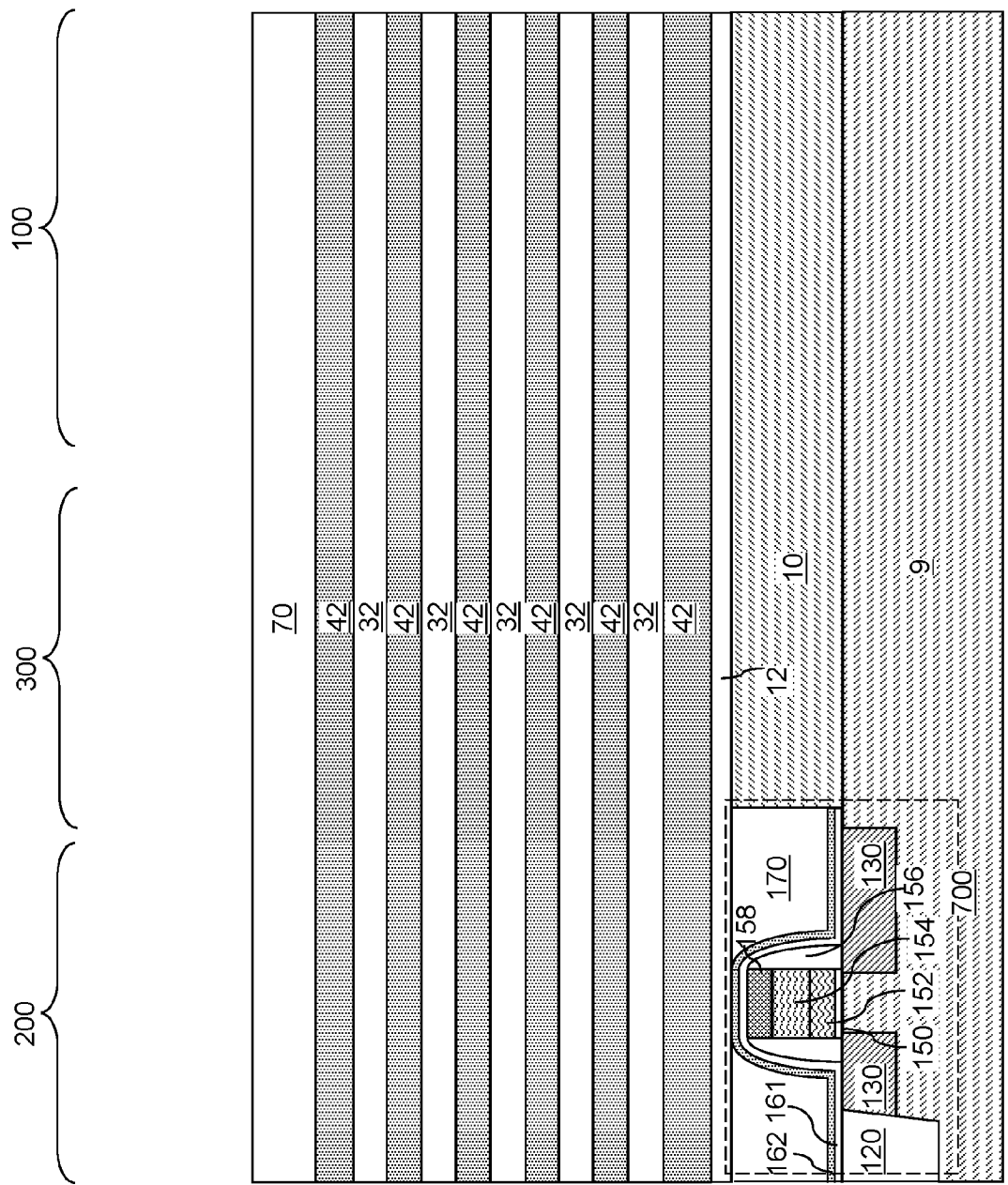
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. As used herein, an "oxynitride" refers to a compound including oxygen, nitrogen, and an element other than oxygen and nitrogen such that nitrogen atoms account for a percentage between 1% and 99% of the sum of the oxygen atoms and the nitrogen atoms.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide layers, and sacrificial material layers can include silicon nitride layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
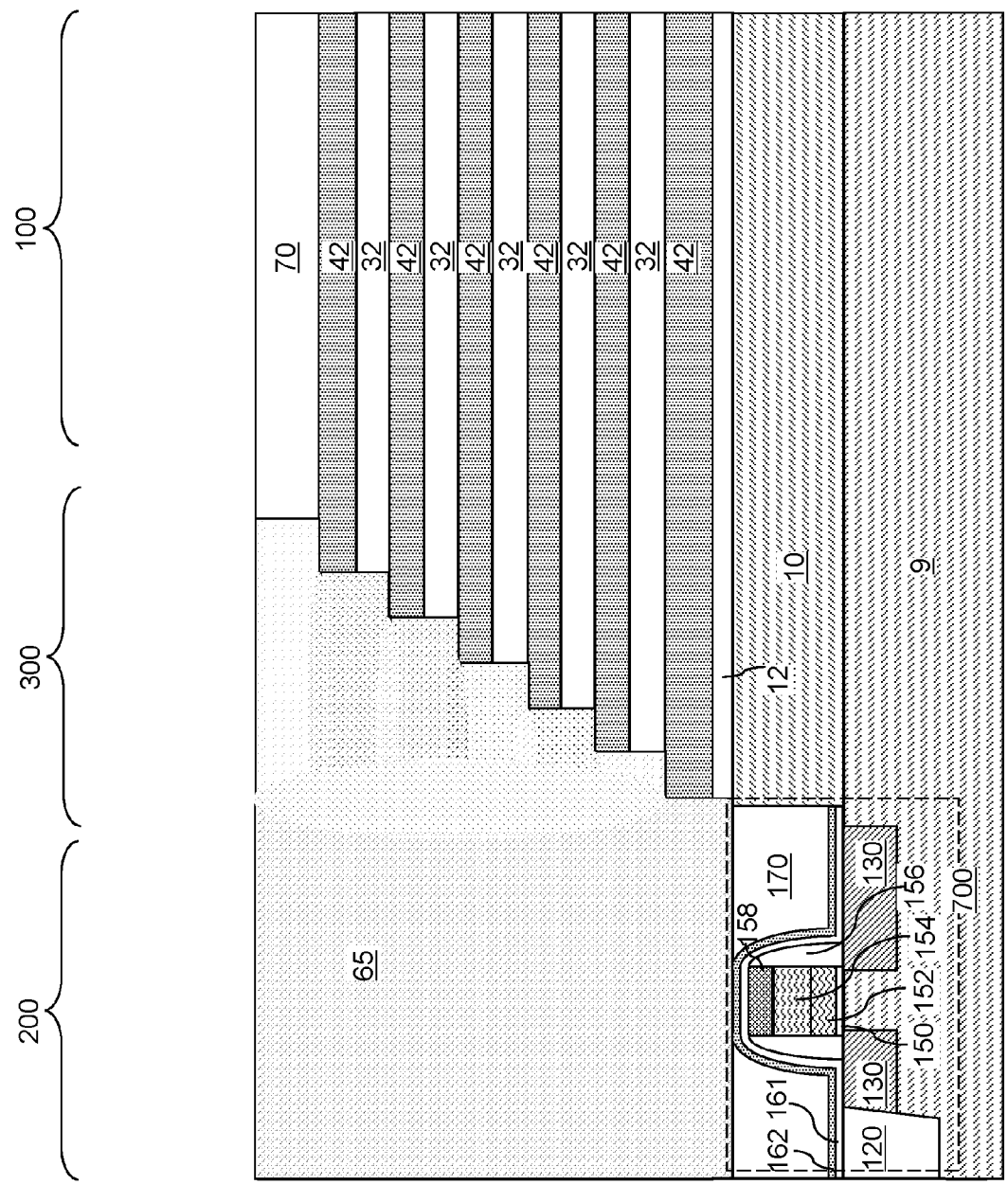
FIG. 3 is a schematic vertical cross-sectional view of the exemplary structure after formation of stepped terraces and a retro-stepped dielectric material portion according to an embodiment of the present disclosure.

Referring to FIG. 3, stepped terraces can be formed in the contact region 300. The portion of the contact region 300 that includes the stepped terraces is herein referred to as a terrace region. The stepped terraces can be formed by forming a stepped cavity within the contact region 300. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

Within the terrace region formed on the alternating stack (32, 42), each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A dielectric material such as silicon oxide is deposited over the stepped terraces in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity in the contact region 300 and the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the insulating cap layer 70.

Figure 4:
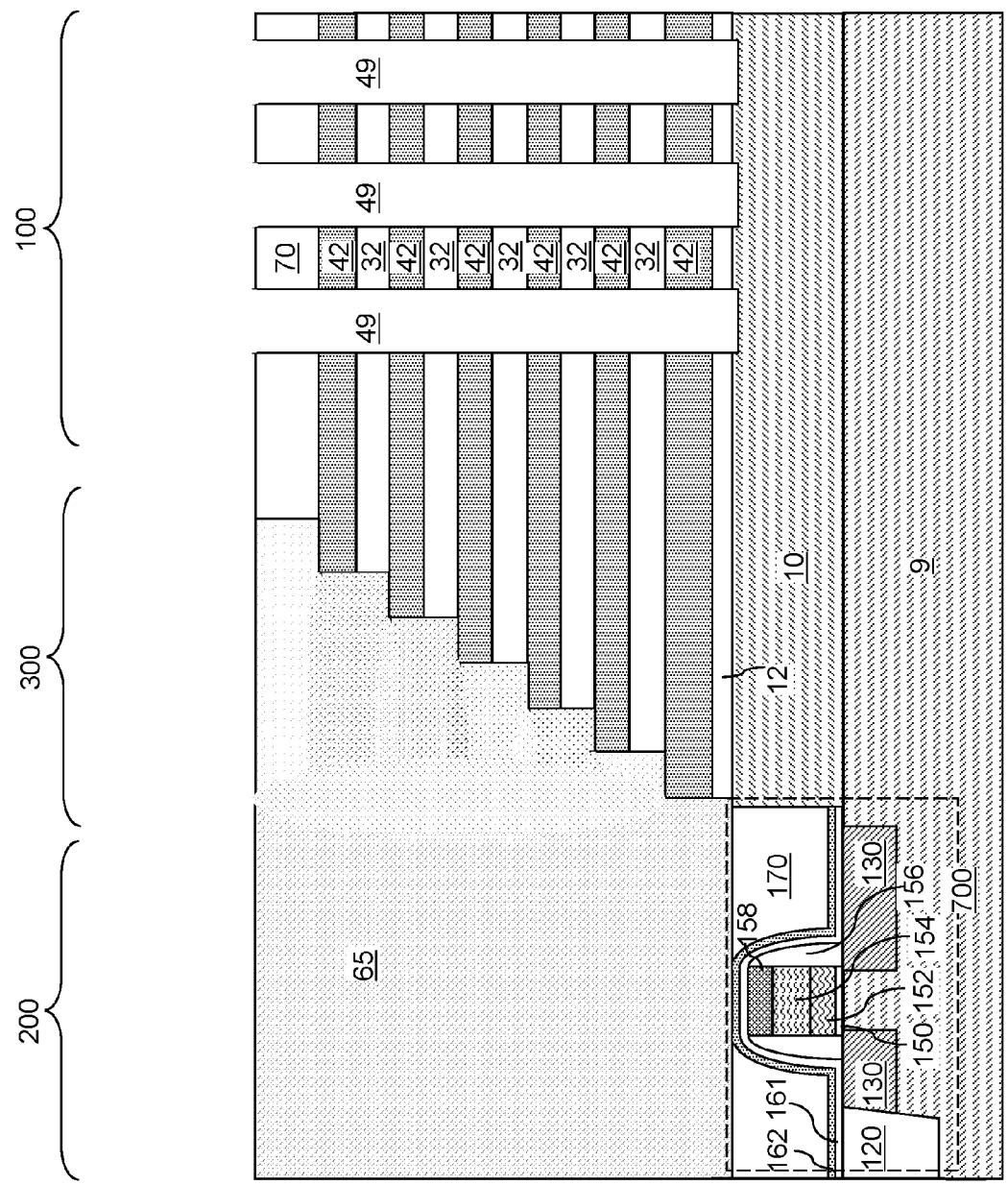
FIG. 4 is a schematic vertical cross-sectional view of the exemplary structure after formation of memory openings according to an embodiment of the present disclosure.

Referring to FIG. 4, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The array of memory openings 49 is formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

FIGS. 5A-5H illustrate sequential schematic vertical cross-sectional views of a memory opening 49 within the exemplary structure during formation of a first exemplary memory stack structure according to a first embodiment of the present disclosure.

Referring to FIG. 5A, a memory opening 49 in the exemplary device structure of FIG. 4 is illustrated. The memory opening 49 extends through the insulating cap layer 70, the alternating stack (32, 42), an optional dielectric cap layer 31, such as a silicon oxide layer, the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a nitridation process is performed to convert surface portions of the insulating layers 32 into nitrogen-containing dielectric material portions. The nitridation process can include a thermal nitridation process, a plasma nitridation process, or a combination thereof. In case a thermal nitridation process is employed, an anneal in an ammonia-containing ambient at an elevated temperature (such a temperature in a range from 600 degrees Celsius to 1,000 degrees Celsius) can be employed. If a plasma nitridation process is employed, a plasma of $NH_3$, NO, $NO_2$, or another nitrogen-containing gas may be employed. In one embodiment, the sacrificial material layers 42 can include a dielectric nitride material, and the composition of the dielectric nitride material of the sacrificial material layers 42 do not change under the nitridation process.

In one embodiment, the insulating layers 32 can include a dielectric oxide material, and the nitrogen-containing dielectric material portions can be dielectric oxynitride portions that are subsequently employed as components of a blocking dielectric. The dielectric oxynitride portions are herein referred to as first blocking dielectric material portions 522. The first blocking dielectric material portions 522 include a dielectric compound that includes oxygen atoms and nitrogen atoms. The material composition of the first blocking dielectric material portions 522 is herein referred to as a first material composition. A semiconductor nitride portion 13 is collaterally formed by conversion of a surface portion of the epitaxial channel portion 11 into a semiconductor nitride material during the nitridation process that forms the first blocking dielectric material portions 522. If the epitaxial channel portion 11 includes silicon, the semiconductor nitride portion 13 can include silicon nitride.

In one embodiment, the sacrificial material layers 42 can include silicon nitride, the insulating layers 32 can include silicon oxide (which may be undoped silicate glass or a doped silicate glass such as borosilicate glass, borophosphosilicate glass, or organosilicate glass), and the first blocking dielectric material portions 522 can be silicon oxynitride portions. In this case, the first blocking dielectric material portions 522 are referred to as first silicon oxynitride portions, which are formed by converting surface portions of the insulating layers 32 (which includes silicon oxide) from around the memory opening 49 into a first silicon oxynitride material. In one embodiment, the first silicon oxynitride material of the first blocking dielectric material portions 522 can have an average composition of $Si_3O_{6(1-\gamma)}N_{4\gamma}$, in which $\gamma$ has a value in a range from 0.05 to 0.99, although lesser and greater values can also be employed. In one embodiment, $\gamma$ can have a value in a range from 0.5 to 0.95. Minimally nitrided portions of the silicon oxide material in which atomic percentage of nitrogen atoms among the set of all oxygen atoms and all nitrogen atoms is less than 1% is considered silicon oxide.

In one embodiment, the first blocking dielectric material portions 522 can have a lateral nitrogen concentration gradient such that atomic concentration of nitrogen decreases with distance from the sidewalls of the memory opening 49. The thickness of the first blocking dielectric material portions 522 depends on the conditions of the nitridation process, and can be in a range from 1 nm to 10 nm (such as from 3 nm to 6 nm), although lesser and greater thicknesses can also be employed.

Referring to FIG. 5D, an oxidation process can be performed to change the composition of the first blocking dielectric material portions 522 and to form second blocking dielectric material portions 524. The oxidation process can be a thermal oxidation process, a plasma oxidation process, or a combination thereof. If a thermal oxidation process is employed, an oxidizing ambient including an oxidation agent (such as $O_2$ or steam) at an elevated temperature (such as a temperature in a range from 600 degrees Celsius to 1,000 degrees Celsius) can be employed, such as in-situ steam generation oxidation ("ISSG") process. If a plasma oxidation process is employed, plasma of an oxygen-containing gas (such as $O_2$ or $O_3$) can be employed.

The composition of the first blocking dielectric portions 522 is modified to include a higher atomic concentration of oxygen atoms during the oxidation process. Further, a surface portion of each sacrificial material layer 42 can be modified in composition to form oxygen-containing dielectric material portions, which are herein referred to as second blocking dielectric portions 524.

In one embodiment, the sacrificial material layers 42 can include a dielectric nitride material, and the second blocking dielectric portions 524 can be dielectric oxynitride portions that are subsequently employed as components of a blocking dielectric. The second blocking dielectric portions 524 include a dielectric compound that includes oxygen atoms and nitrogen atoms. The material composition of the second blocking dielectric portions 524 is herein referred to as a second material composition, which can be different from the first material composition of the first blocking dielectric portions 522 as modified by the oxidation process. The semiconductor nitride portion 13 can be converted into a semiconductor oxynitride portion 17 during the oxidation process that forms the second blocking dielectric material portions 524. If the epitaxial channel portion 11 includes silicon, the semiconductor oxynitride portion 17 can include silicon oxynitride.

In one embodiment, the sacrificial material layers 42 can include silicon nitride, the insulating layers 32 can include silicon oxide, and the first blocking dielectric material portions 522 can be silicon oxynitride portions. In this case, the first blocking dielectric material portions 522 are first silicon oxynitride portions formed with an average composition of $Si_3O_{6(1-\gamma)}N_{4\gamma}$, in which $\gamma$ has a value in a range from 0.05 to 0.99, and is converted into material portions having an average composition of $Si_3O_{6(1-\delta)}N_{4\delta}$, in which $\delta$ has a value in a range from 0.02 to 0.70. In one embodiment, $\delta$ can have a value in a range from 0.05 to 0.4. In an embodiment, $\gamma$ can be greater than $\delta$. The second blocking dielectric material portions 524 are second silicon oxynitride portions formed with an average composition of $Si_3O_{6(1-\in)}N_{4\in}$, in which $\in$ has a value in a range from 0.05 to 0.99. In one embodiment, $\in$ can have a value in a range from 0.1 to 0.8. In an embodiment, the second material composition of the second silicon oxynitride portions (which are the second blocking dielectric material portions 524) has a greater atomic concentration of nitrogen than the first material composition (as modified by oxidation) of the first silicon oxynitride portions (which are the first blocking dielectric material portions 522) because the second silicon oxynitride portions are formed by oxidation of a silicon nitride while the first silicon oxynitride portions are formed by oxidation of a silicon oxynitride.

In one embodiment, the second blocking dielectric material portions 524 can have a lateral nitrogen concentration gradient such that atomic concentration of nitrogen decreases with distance from the sidewalls of the memory opening 49. The thickness of the second blocking dielectric material portions 524 can be less than the thickness of the first blocking dielectric material portions 522. For example, the thickness of the first blocking dielectric material portions 522 can be in a range from 0.5 nm to 6 nm (such as from 1.5 nm to 3 nm), although lesser and greater thicknesses can also be employed. In this case, the second silicon oxynitride portions (i.e., the second blocking dielectric material portions 524) can be formed by converting surface portions of the silicon nitride layers into the second silicon oxynitride material which has a greater atomic concentration of nitrogen than the first silicon oxynitride material present in the first blocking dielectric material portions 522.

In one embodiment, the first blocking dielectric material portions 522 can comprise a first silicon oxynitride including a first average atomic concentration of nitrogen atoms, the second blocking dielectric material portions 524 comprise a second silicon oxynitride including a second average atomic concentration of nitrogen atoms, and the second average atomic concentration of nitrogen atoms is different from the first average atomic concentration of nitrogen atoms. The second average atomic concentration of nitrogen atoms can be greater than the first average atomic concentration.

The first blocking dielectric material portions 522 have the first material composition, and contacts sidewalls of the insulating layers 32. The vertical extent of the first blocking dielectric material portions 522 is limited to the vertical extent of the insulating layers 32. Thus, the first blocking dielectric material portions 522 are not located at the levels of the sacrificial material layers 42. The second blocking dielectric material portions 524 have the second material composition, and are located at levels of a subset of the sacrificial material layers 42 that are located above a horizontal plane including the top surface of the epitaxial channel portion 11. The second blocking dielectric material portions 524 are provided as discrete annular dielectric material portions that are vertically spaced from one another, and having respective vertical extent that is the same as the vertical extent of a sacrificial material layer 42 located at the same level.

In one embodiment, the inner sidewalls of the first blocking dielectric material portions 522 may be vertically coincident with inner sidewalls of the second blocking dielectric material portions 524. The inner sidewalls of the first blocking dielectric material portions 522 and the inner sidewalls of the second blocking dielectric material portions 524 are physically exposed to the cavity 49' that is present within the memory opening 49. As used herein, two surfaces are "vertically coincident" if the two surfaces are vertically offset from each other and a vertical plane exists that includes the two surfaces.

Referring to FIG. 5E, an optional front side blocking dielectric layer 526 can be formed on the sidewalls of the first blocking dielectric material portions 522 and the second blocking dielectric material portions 524 by a conformal deposition process. The optional front side blocking dielectric layer 526 can be subsequently employed as a component of a blocking dielectric 52. The front side blocking dielectric layer 526 is an optional structure that may be omitted. The front side blocking dielectric layer 526 can include an insulating oxide, such as silicon oxide or a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the front side blocking dielectric layer 526 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. Layer 526 can be deposited, for example, by chemical vapor deposition (CVD), atomic layer deposition (ALD), pulsed laser deposition (PLD), liquid source misted chemical deposition, or a combination thereof. The thickness layer 526 can be in a range from 1 nm to 20 nm, although lesser and greater thicknesses can also be employed. In one embodiment, the front side blocking dielectric layer 526 includes silicon oxide or aluminum oxide. In one embodiment, the front side blocking dielectric layer 526 can include multiple dielectric metal oxide and/or silicon oxide layers having different material compositions.

The set of all first blocking dielectric material portions 522, all second blocking dielectric material portions 524, and the front side blocking dielectric layer 526 constitutes a blocking dielectric 52, which is a dielectric that provides electrical isolation between a charge storage region and a control gate in a three-dimensional memory device.

In one embodiment, the blocking dielectric 52 can have a greater thickness at levels of the insulating layers 32 than at levels of the sacrificial material layers 42. The blocking dielectric 52 is formed around, and/or within, each memory opening 49. Specifically, the first blocking dielectric material portions 522 and the second blocking dielectric material portions 524 are formed around each memory opening 49. The front side blocking dielectric layer 526 is formed within the memory openings 49.

Subsequently, a charge storage layer 54 can be formed on the blocking dielectric 52 within each memory opening 49 by a conformal deposition. The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

A tunneling dielectric 56 is formed on the charge storage layer 54 within each memory opening 49. The tunneling dielectric 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric 56 can include a stack of a first silicon oxide layer, a silicon oxynitride layer, and a second silicon oxide layer, which is commonly known as an ONO stack. In one embodiment, the tunneling dielectric 56 can include a silicon oxide layer that is substantially free of carbon or a silicon oxynitride layer that is substantially free of carbon. The thickness of the tunneling dielectric 56 can be in a range from 2 nm to 20 nm, although lesser and greater thicknesses can also be employed.

An optional first semiconductor channel layer 601 can be formed on the tunneling dielectric 56 within each memory opening 49. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

The optional first semiconductor channel layer 601, the tunneling dielectric 56L, the charge storage layer 54, the blocking dielectric 52, and the semiconductor oxynitride portion 17 are sequentially anisotropically etched employing at least one anisotropic etch process. The horizontal portions of the first semiconductor channel layer 601, the tunneling dielectric 56, the charge storage layer 54, and the blocking dielectric 52 located above the top surface of the insulating cap layer 70 can be removed by the at least one anisotropic etch process. Further, the horizontal portions of the first semiconductor channel layer 601, the tunneling dielectric 56, the charge storage layer 54, and the blocking dielectric 52 at a bottom of each cavity 49' can be removed to form openings in remaining portions thereof. The semiconductor oxynitride portion 17 can be subsequently etched to become an annular structure including an opening therethrough. Each of the first semiconductor channel layer 601, the tunneling dielectric 56, the charge storage layer 54, the blocking dielectric 52, and semiconductor oxynitride portion 17 may be etched by a respective anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) covered by the can be physically exposed underneath the opening through the first semiconductor channel layer 601, the tunneling dielectric 56, the charge storage layer 54, the blocking dielectric 52, and the semiconductor oxynitride portion 17. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 56 is located over the charge storage layer 54. A set of a blocking dielectric 52, a charge storage layer 54, and a tunneling dielectric 56 in a memory opening 49 constitutes a memory film 50, which includes a plurality of charge storage regions (as embodied as the charge storage layer 54) that are insulated from surrounding materials by the blocking dielectric 52 and the tunneling dielectric 56. In one embodiment, the first semiconductor channel layer 601, the tunneling dielectric 56, the charge storage layer 54, and the blocking dielectric 52 can have vertically coincident sidewalls.

Referring to FIG. 5F, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric 56 is surrounded by a charge storage layer 54, and laterally surrounds a portion of the semiconductor channel 60. Each adjoining set of a blocking dielectric 52, a charge storage layer 54, and a tunneling dielectric 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

FIGS. 6A-6H illustrate sequential schematic vertical cross-sectional views of a memory opening 49 within the exemplary structure during formation of a second exemplary memory stack structure according to a second embodiment of the present disclosure. The second exemplary memory stack structure can be formed in lieu of the first exemplary memory structure in each memory opening 49 of the exemplary structure illustrated in FIG. 4. The method of the second embodiment differs from the method of the first embodiment in that an additional silicon nitride layer 623 is formed between the nitridation and oxidation steps described in the first embodiment.

Referring to FIG. 6A, a memory opening 49 in the exemplary device structure of FIG. 4 is illustrated. The memory opening 49 of FIG. 6A can be the same as the memory opening of FIG. 5A.

Referring to FIG. 6B, an optional epitaxial channel portion (e.g., an epitaxial pedestal) 11 can be formed at the bottom portion of each memory opening 49, for example, by selective epitaxy. The epitaxial channel portion 11 illustrated in FIG. 6B can be the same as the epitaxial channel portion 11 illustrated in FIG. 5B.

A nitridation process is performed to convert surface portions of the insulating layers 32 into nitrogen-containing dielectric material portions. The nitridation process can include a thermal nitridation process, a plasma nitridation process, or a combination thereof. The nitridation process may be the same as the nitridation process that can be employed at the processing steps of FIG. 5C.

In one embodiment, the insulating layers 32 can include a dielectric oxide material, and the nitrogen-containing dielectric material portions can be dielectric oxynitride portions that are subsequently employed as components of a blocking dielectric. The dielectric oxynitride portions are herein referred to as first blocking dielectric material portions 522. The first blocking dielectric material portions 522 include a dielectric compound that includes oxygen atoms and nitrogen atoms. The material composition of the first blocking dielectric material portions 522 is herein referred to as a first material composition. A semiconductor nitride portion 18 is collaterally formed by conversion of a surface portion of the epitaxial channel portion 11 into a semiconductor nitride material during the nitridation process that forms the first blocking dielectric material portions 522. If the epitaxial channel portion 11 includes silicon, the semiconductor nitride portion 18 can include silicon nitride.

In one embodiment, the sacrificial material layers 42 can include silicon nitride, the insulating layers 32 can include silicon oxide (which may be undoped silicate glass or a doped silicate glass such as borosilicate glass, borophosphosilicate glass, or organosilicate glass), and the first blocking dielectric material portions 522 can be silicon oxynitride portions. In this case, the first blocking dielectric material portions 522 are referred to as first silicon oxynitride portions, which are formed by converting surface portions of the insulating layers 32 (which includes silicon oxide) from around the memory opening 49 into a first silicon oxynitride material. In one embodiment, the first silicon oxynitride material of the first blocking dielectric material portions 522 can have an average composition of $Si_3O_{6(1-\gamma)}N_{4\gamma}$, in which $\gamma$ has a value in a range from 0.05 to 0.99, although lesser and greater values can also be employed. In one embodiment, $\gamma$ can have a value in a range from 0.5 to 0.95. Minimally nitrided portions of the silicon oxide material in which atomic percentage of nitrogen atoms among the set of all oxygen atoms and all nitrogen atoms is less than 1% is considered silicon oxide.

In one embodiment, the first blocking dielectric material portions 522 can have a lateral nitrogen concentration gradient such that atomic concentration of nitrogen decreases with distance from the sidewalls of the memory opening 49. The thickness of the first blocking dielectric material portions 522 depends on the conditions of the nitridation process, and can be in a range from 1 nm to 10 nm (such as from 3 nm to 6 nm), although lesser and greater thicknesses can also be employed.

Referring to FIG. 6C, a conformal silicon nitride layer 623 can be formed on the sidewalls of the sacrificial material layers 42 and sidewalls of the first silicon oxynitride portions 522 within the memory opening 49. The conformal silicon nitride layer 623 can include a substantially stoichiometric silicon nitride, or may include a silicon-rich silicon nitride. The conformal silicon nitride layer 623 can be deposited by a conformal deposition process such as atomic layer deposition (ALD) or chemical vapor deposition (CVD). The thickness of the conformal silicon nitride layer 623 can be in a range from 1 nm to 6 nm, although lesser and greater thicknesses can also be employed. The conformal silicon nitride layer 623 can be deposited directly on a top surface of the silicon nitride portion 18.

Referring to FIG. 6D, an oxidation process can be performed to diffuse oxygen atoms into the conformal silicon nitride layer 623 and the semiconductor nitride portion 18 around each memory opening 49. The oxidation process can be a thermal oxidation process, a plasma oxidation process, or a combination thereof. If a thermal oxidation process is employed, an oxidizing ambient including an oxidation agent (such as $O_2$ or steam) at an elevated temperature (such as a temperature in a range from 600 degrees Celsius to 1,000 degrees Celsius) can be employed, such as an ISSG oxidation process. If a plasma oxidation process is employed, plasma of an oxygen-containing gas (such as $O_2$ or $O_3$) can be employed.

The compositions of the conformal silicon nitride layer 623 and optionally the semiconductor nitride portion 18 and/or the sacrificial material layer 42 edge portions are modified to include oxygen atoms therein. In one embodiment, a silicon oxynitride layer 624 is formed by conversion of the conformal silicon nitride layer 623 into a continuous layer of a silicon oxynitride material. In one embodiment, the epitaxial channel portions 11 can include amorphous silicon or polysilicon, and the semiconductor nitride portion 18 can be a silicon nitride portion. In this case, the semiconductor nitride portion 18 can optionally be converted into an additional silicon oxynitride portion, and can be incorporated into the silicon oxynitride layer 624. In this case, the vertical portions of the silicon oxynitride layer 624 can have a first uniform thickness, and the horizontal portion of the silicon oxynitride layer 624 can have a second uniform thickness that is greater than the first uniform thickness.

The material composition of the silicon oxynitride layer 624 is herein referred to as a second material composition. The silicon oxynitride layer 624 includes a second silicon oxynitride material that can be different from the first material composition of the first blocking dielectric portions 522. The composition of the first blocking dielectric portions 522 can be collaterally modified to include more oxygen atoms during the oxidation process that forms the silicon oxynitride layer 624.

In one embodiment, the sacrificial material layers 42 can include silicon nitride, the insulating layers 32 can include silicon oxide, and the first blocking dielectric material portions 522 can be silicon oxynitride portions. In this case, the first blocking dielectric material portions 522 are first silicon oxynitride portions formed with an average composition of $Si_3O_{6(1-\gamma)}N_{4\gamma}$, in which $\gamma$ has a value in a range from 0.05 to 0.99, and is converted into material portions having an average composition of $Si_3O_{6(1-\delta)}N_{4\delta}$, in which $\delta$ has a value in a range from 0.02 to 0.70. In one embodiment, $\delta$ can be greater than $\gamma$, and $\delta$ can have a value in a range from 0.05 to 0.4. The silicon oxynitride layer 624 includes second silicon oxynitride portions formed at each level of the insulating layers 32 and sacrificial material layers 42. The silicon oxynitride layer 624 can be formed with an average composition of $Si_3O_{6(1-\in)}N_{4\in}$, in which $\in$ has a value in a range from 0.05 to 0.99. In one embodiment, $\in$ can have a value in a range from 0.1 to 0.8. In one embodiment, the atomic concentration of nitrogen in the second material composition of the second silicon oxynitride portions (which are various portions of the silicon oxynitride layer 624) may be greater than, the same as, or less than, the atomic concentration of nitrogen in the first silicon oxynitride portions (which are the first blocking dielectric material portions 522) depending on the process conditions of the nitridation process employed to form the first blocking dielectric portions 522 and the process conditions of the oxidation process employed to form the silicon oxynitride layer 624.

In one embodiment, the silicon oxynitride layer 624 can have a lateral nitrogen concentration gradient such that atomic concentration of nitrogen decreases with distance from the sidewalls of the memory opening 49. In an illustrative example, the thickness of the first blocking dielectric material portions 522 can be in a range from 0.5 nm to 6 nm (such as from 1.0 nm to 3 nm), although lesser and greater thicknesses can also be employed. The thickness of the silicon oxynitride layer 624 can be in a range from 1 nm to 6 nm, although lesser and greater thicknesses can also be employed.

In one embodiment, the first blocking dielectric material portions 522 can comprise a first silicon oxynitride including a first average atomic concentration of nitrogen atoms, the silicon oxynitride layer 624 (which is a second blocking dielectric material portion that is subsequently employed as a component of a blocking dielectric) comprises a second silicon oxynitride including a second average atomic concentration of nitrogen atoms, and the second average atomic concentration of nitrogen atoms is different from the first average atomic concentration of nitrogen atoms. The second average atomic concentration of nitrogen atoms can be greater than, less than, or equal to, the first average atomic concentration.

The first blocking dielectric material portions 522 have the first material composition, and contact sidewalls of the insulating layers 32. Further, inner sidewalls of the first blocking dielectric material portions 522 contact outer sidewalls of the second blocking dielectric material portion as embodied as the silicon oxynitride layer 624. The vertical extent of the first blocking dielectric material portions 522 is limited to the vertical extent of the insulating layers 32. Thus, the first blocking dielectric material portions 522 are not located at the levels of the sacrificial material layers 42. The silicon oxynitride layer 624 has the second material composition, and the second blocking dielectric portions within the silicon oxynitride layer 624 are located at each levels of the alternating stack (32, 42) that is located above the horizontal plane including the top surface of the epitaxial channel portion 11. Thus, the second blocking dielectric portions within the silicon oxynitride layer 624 are located at least at levels of a subset of the sacrificial material layers 42 located above the horizontal plane including the top surface of the epitaxial channel portion 11. The second blocking dielectric material portion of the silicon oxynitride layer 624 is a single continuous material portion that vertically extends from a bottommost sacrificial material layer 42 above the horizontal plane including the top surface of the epitaxial channel portion 11 to a topmost sacrificial material layer 42.

In one embodiment, the inner sidewalls of the first blocking dielectric material portions 522 may be vertically coincident with outer sidewalls of the horizontal plane including the top surface of the epitaxial channel portion 11. The first blocking dielectric material portions 522 are laterally offset from the cavity 49' by the thickness of the silicon oxynitride layer 624.

Figure 6E:
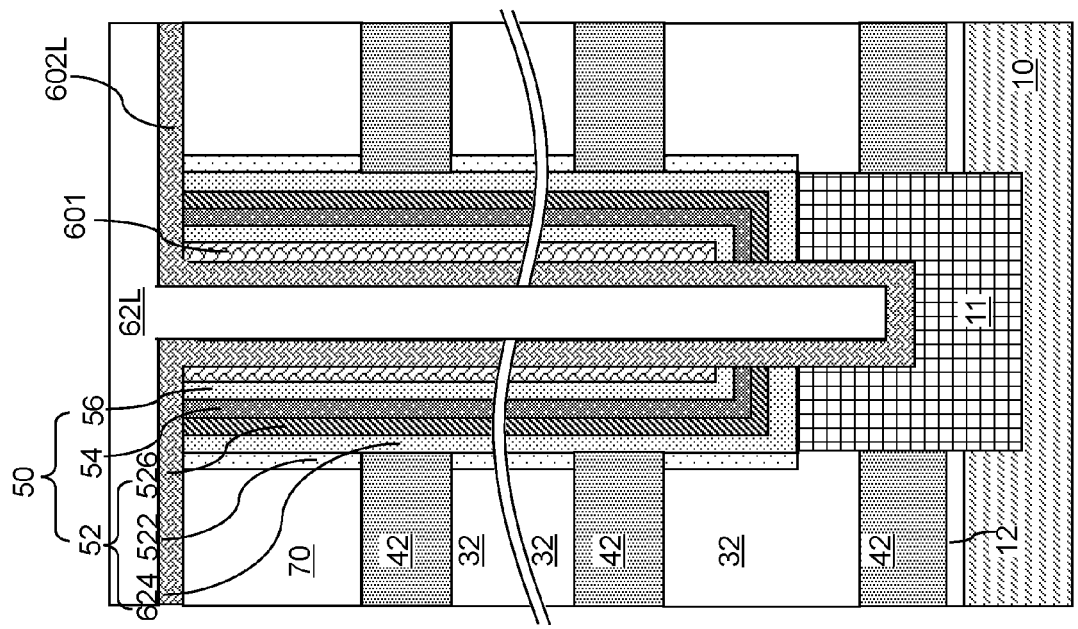

Referring to FIG. 6E, an optional front side blocking dielectric layer 526 can be formed on the sidewalls of the silicon oxynitride layer 624 by a conformal deposition process. The optional layer 526 can be subsequently employed as a component of a blocking dielectric 52. Layer 526 can be the same as layer 526 in the first embodiment.

The set of all first blocking dielectric material portions 522, the silicon oxynitride layer 624, and the front side blocking dielectric layer 526 constitutes a blocking dielectric 52, which is a dielectric that provides electrical isolation between a charge storage region and a control gate in a three-dimensional memory device.

The blocking dielectric 52 has a greater thickness at levels of the insulating layers 32 than at levels of the sacrificial material layers 42. The blocking dielectric 52 is formed around, and/or within, each memory opening 49. Specifically, the first blocking dielectric material portions 522 are formed around each memory opening 49. The silicon oxynitride layer 624 and the front side blocking dielectric layer 526 are formed within the memory openings 49.

Subsequently, a charge storage layer 54 can be formed on the blocking dielectric 52 within each memory opening 49 by a conformal deposition. The charge storage layer 54 can be the same as in the first embodiment. A tunneling dielectric 56 is formed on the charge storage layer 54 within each memory opening 49. The tunneling dielectric 56 can be the same as in the first embodiment. An optional first semiconductor channel layer 601 can be formed on the tunneling dielectric 56 within each memory opening 49. The optional first semiconductor channel layer 601 can be the same as in the first embodiment.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric 56, the charge storage layer 54, the blocking dielectric 52, and the optional semiconductor oxynitride portion 18. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 56 is located over the charge storage layer 54. A set of a blocking dielectric 52, a charge storage layer 54, and a tunneling dielectric 56 in a memory opening 49 constitutes a memory film 50, which includes a plurality of charge storage regions (as embodied as the charge storage layer 54) that are insulated from surrounding materials by the blocking dielectric 52 and the tunneling dielectric 56. In one embodiment, the first semiconductor channel layer 601, the tunneling dielectric 56, the charge storage layer 54, and the blocking dielectric 52 can have vertically coincident sidewalls.

Figure 6F:
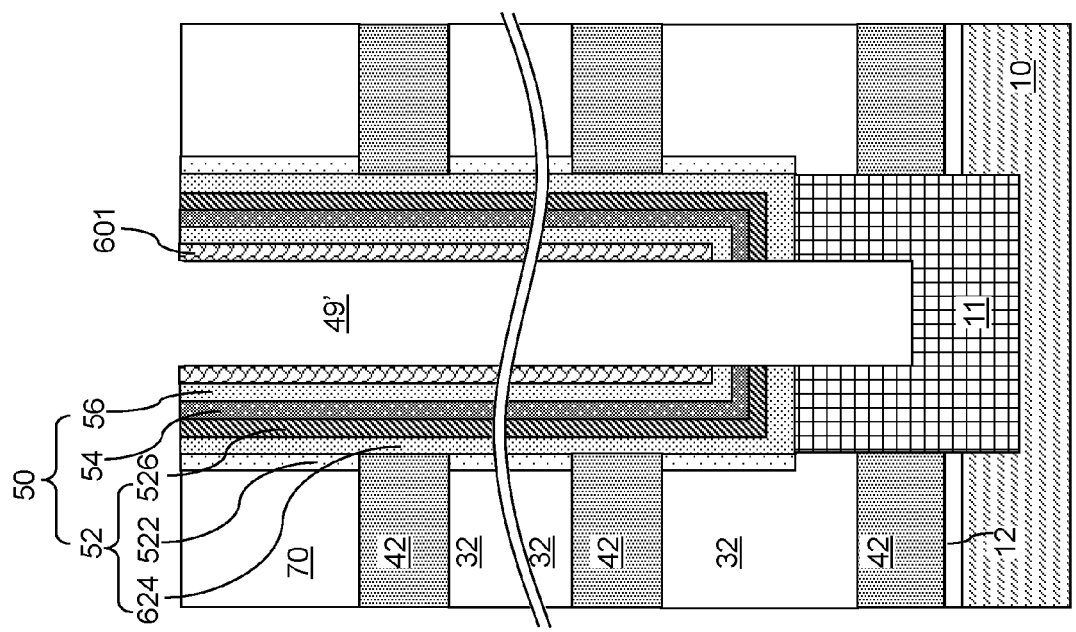

Referring to FIG. 6F, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The materials of the first semiconductor channel layer 601 and the second semiconductor channel layer 602 are collectively referred to as a semiconductor channel material.

In case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric 56 is surrounded by a charge storage layer 54, and laterally surrounds a portion of the semiconductor channel 60. Each adjoining set of a blocking dielectric 52, a charge storage layer 54, and a tunneling dielectric 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Referring to FIG. 6H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 7:
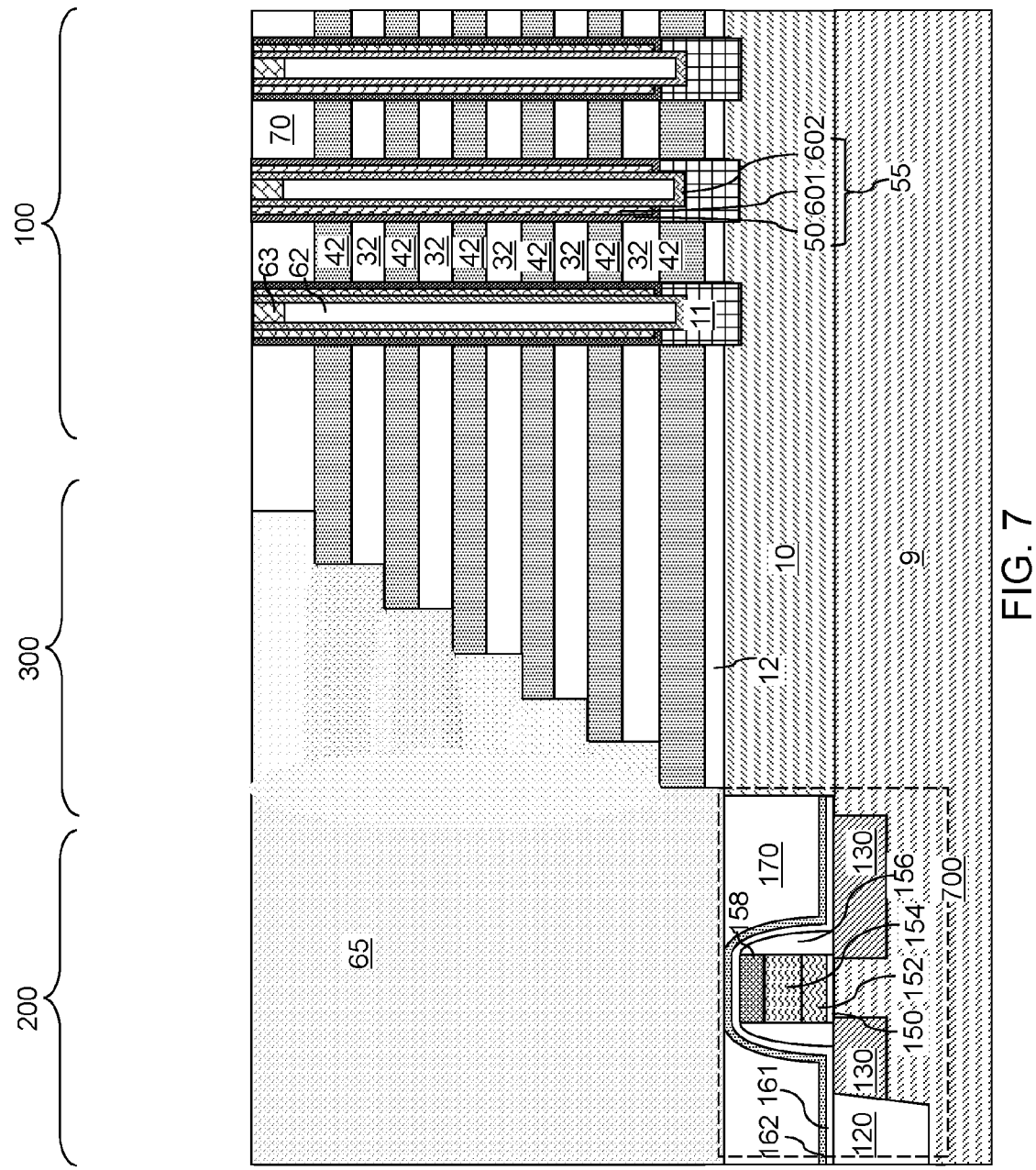
FIG. 7 is a schematic vertical cross-sectional view of the exemplary structure after formation of memory stack structures according to an embodiment of the present disclosure.

An instance of exemplary memory stack structure 55 of FIG. 5H or 6H can be embedded into each memory opening 49 in the exemplary structure illustrated in FIG. 4. FIG. 7 illustrates the exemplary structure that incorporates multiple instances of the first or second exemplary memory stack structure 55. Each exemplary memory stack structure 55 includes a semiconductor channel 60 which may comprise layers (601, 602) and a memory film 50. The memory film 50 may comprise a tunneling dielectric layer 56 laterally surrounding the semiconductor channel 60 and a vertical stack of charge storage regions laterally surrounding the tunneling dielectric layer 56 (as embodied as a memory material layer 54) and an optional blocking dielectric layer 52. The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a blocking dielectric layer 52 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 8A:
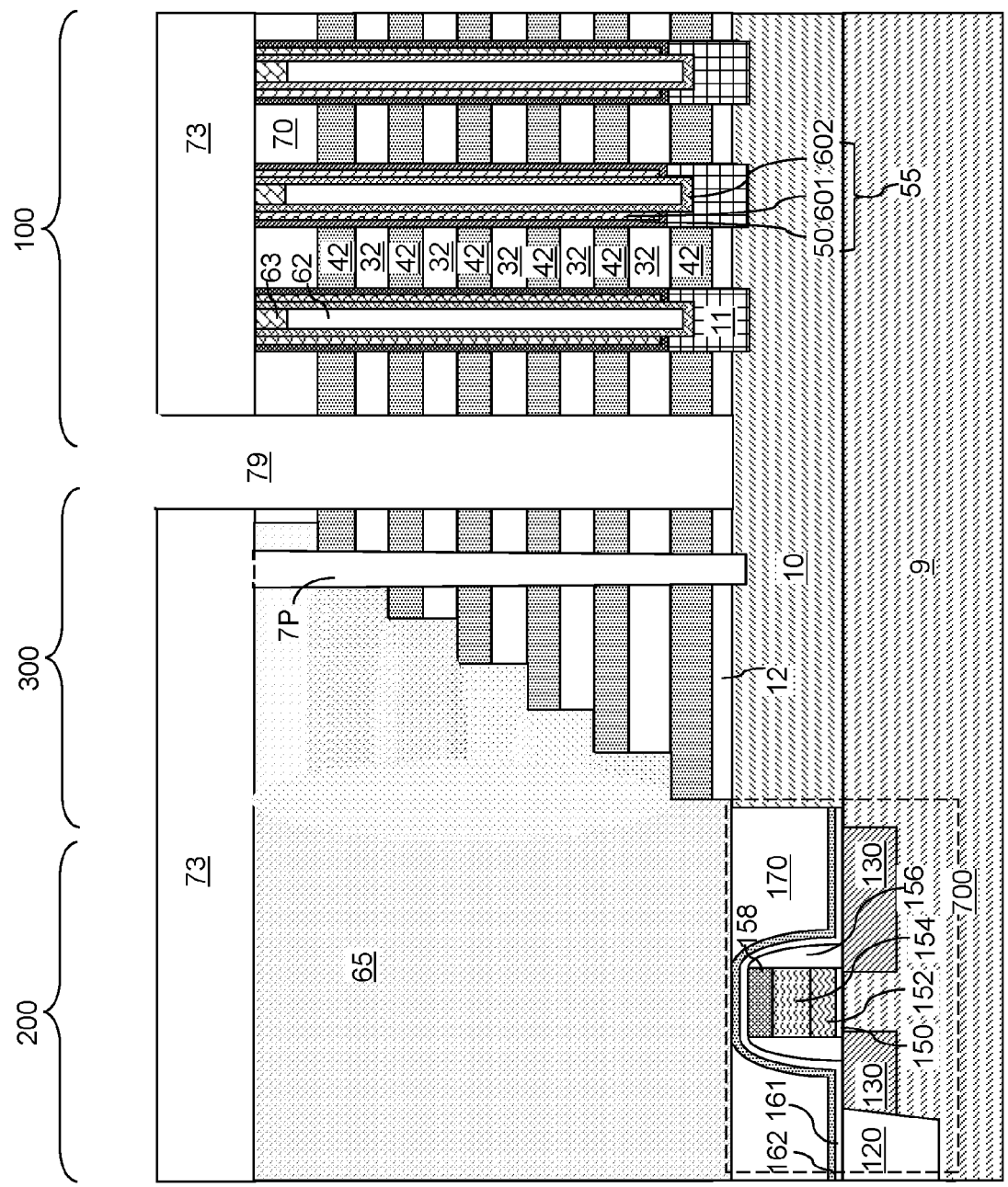
FIG. 8A is a schematic vertical cross-sectional view of the exemplary structure after formation of a backside trench according to an embodiment of the present disclosure.

Referring to FIGS. 8A and 8B, at least one support pillar 7P may be optionally formed through the retro-stepped dielectric material portion 65 and/or through the insulating cap layer 70 and/or through the alternating stack (32, 42). The plane A-A' in FIG. 8B corresponds to the plane of the schematic vertical cross-sectional view of FIG. 8A. In one embodiment, the at least one support pillar 7P can be formed in the contact region 300, which is located adjacent to the memory array region 100. The at least one support pillar 7P can be formed, for example, by forming an opening extending through the retro-stepped dielectric material portion 65 and/or through the alternating stack (32, 42) and at least to the top surface of the substrate (9, 10), and by filling the opening with a material that is resistant to the etch chemistry to be employed to remove the sacrificial material layers 42.

In one embodiment, the at least one support pillar 7P comprises a dummy memory stack structure which contains the memory film 50, semiconductor channel 60 and core dielectric 62 which are formed at the same time as the memory stack structures 55. However, the dummy memory stack structures 7P are not electrically connected to bit lines and are used as support pillars rather than as NAND strings. In another embodiment, the at least one support pillar 7P can include an insulating material, such as silicon oxide and/or a dielectric metal oxide such as aluminum oxide. In this embodiment, the portion of the dielectric material that is deposited over the insulating cap layer 70 concurrently with deposition of the at least one support pillar 7P can be present over the insulating cap layer 70 as a contact level dielectric layer 73. Each of the at least one support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 9:
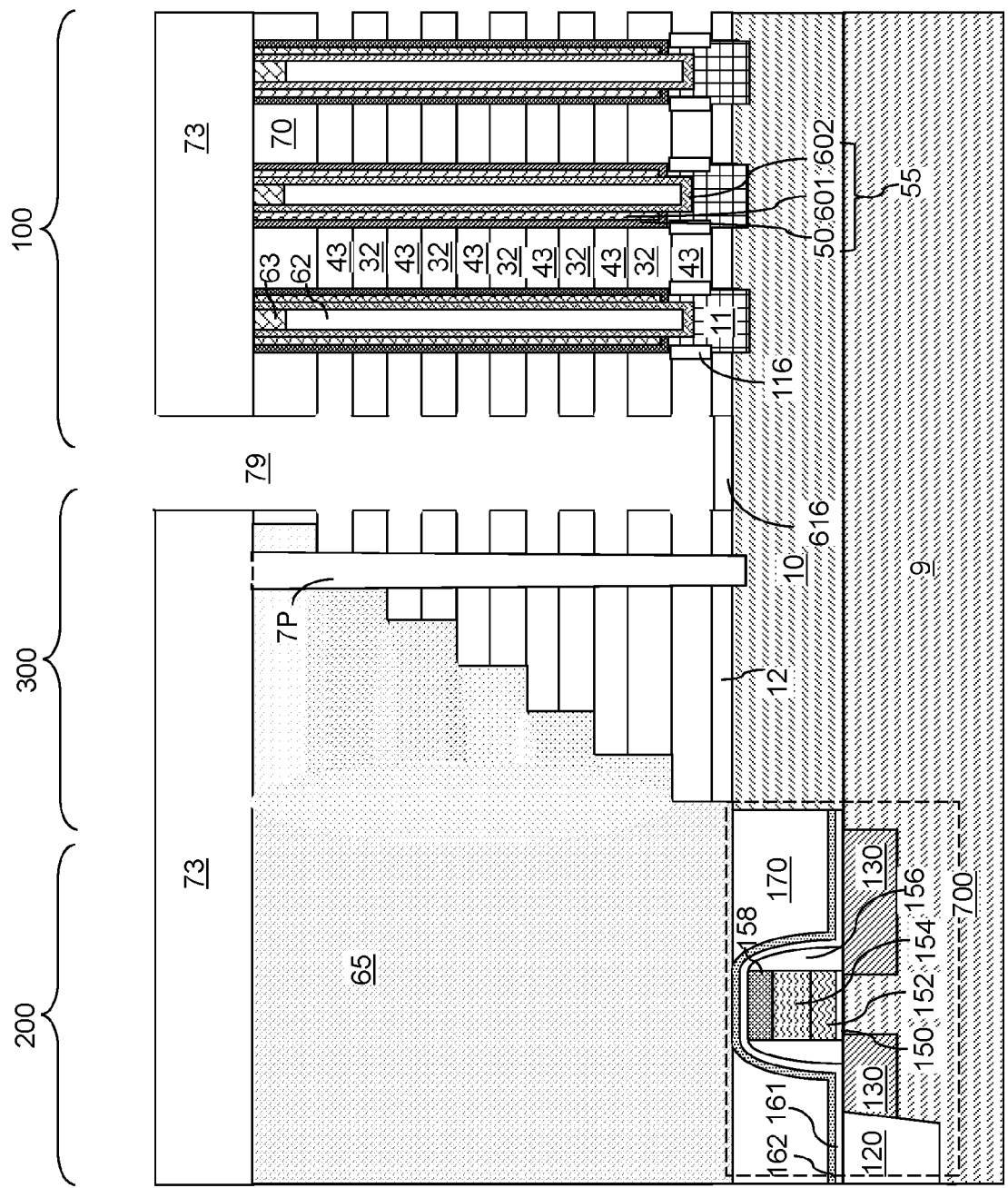
FIG. 9 is a schematic vertical cross-sectional view of the exemplary structure after formation of backside recesses according to an embodiment of the present disclosure.

Referring to FIG. 9, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the semiconductor material layer 10.

For the case of the first embodiment in which the memory stack structures 55 illustrated in FIG. 5H is present in each memory opening 49 in the structure illustrated in FIGS. 8A and 8B, FIGS. 10A-10B illustrate processing steps of the first embodiment that can be employed to remove the sacrificial material layers 42 to form backside recesses 43.

Referring to FIG. 10A, a memory opening including a memory stack structure 55 is shown, which is a region of the exemplary structure illustrated in FIGS. 8A and 8B prior to removal of the sacrificial material layers 42.

Referring to FIG. 10B, the backside recesses 43 are formed by removing the sacrificial material layers 42 and surface portions of the blocking dielectric 52. The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Due to the nitrogen contents therein, the first blocking dielectric material portions 522 and the second blocking dielectric material portions 524 provide less selectivity (i.e., higher etch resistance) to the etchant (e.g., hot phosphoric acid) that removes the silicon nitride material of the sacrificial material layers 42 than the insulating layers 32 that include silicon oxide and are substantially free of nitrogen. In one embodiment, the etch rate of the first blocking dielectric material portions 522 and the second blocking dielectric material portions 524 can be in a range from 3% to 30% of the etch rate of the silicon nitride material of the sacrificial material layers 42, and can be in a range from 3 times the etch rate of the silicon oxide of the insulating layers 32 to 100 times the etch rate of the silicon oxide of the insulating layers 32. Thus, collateral etch of the surface portions of the first blocking dielectric material portions 522 and the second blocking dielectric material portions 524 at a terminal portion of the etch process as the etchant slowly etches physically exposed portions of the first blocking dielectric material portions 522 and the second blocking dielectric material portions 524. In other words, after removal of the silicon nitride layers (as embodied as the sacrificial material layers 42), physically exposed surfaces regions of the first and second blocking dielectric material portions (522, 524) are removed at the terminal portion of the etch process.

The etching of the physically exposed surface regions of the silicon oxynitride portions (i.e., the first and second blocking dielectric material portions (522, 524)) forms a recessed surface on the remaining continuous portion of the blocking dielectric 52 at each level of the sacrificial material layers 42. Each recessed surface can include a substantially vertical sidewall portion 441, an upper concave sidewall portion 442 adjoined to an upper end of the substantially vertical sidewall portion 441, and a lower concave sidewall portion 443 adjoined to a lower end of the substantially vertical sidewall portion 441.

Each backside recess 43 includes a vertically expanded end portion 434 that is more proximal to a most proximate memory stack structure 55 than a substantially vertical interface between the most proximate memory stack structure 55 and the insulating layers 32 is to the most proximate memory stack structure 55. Thus, the vertically expanded end portion 434 extends vertically (i.e., in a direction perpendicular to the top surface of the substrate) between the insulating layers 32 and the memory stack structures 55, such that the concave sidewall portions (441, 442) are located at least partially between the insulating layers 32 and the memory stack structures 55.

Each backside recess 43 further includes a uniform height portion 432 that is more distal from the most proximate memory stack structure 55 than the substantially vertical interface between the most proximate memory stack structure 55 and the insulating layers 32 is to the most proximate memory stack structure 55. Each uniform height portion 432 of the plurality of backside recesses 43 can extend substantially parallel to the top surface of the substrate (9, 10) and can be vertically bounded by a top surface of an underlying insulating layer 32 and a bottom surface of an overlying insulating layer 32. In one embodiment, each uniform height portion 432 of the backside recesses 43 can have a uniform height throughout.

Referring to FIG. 10C, physically exposed surface portions of the optional epitaxial channel portions 11 and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616 (shown in FIG. 13). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. The oxygen concentration in the first and second blocking dielectric material portions (522, 524) may increase during the oxidation process. In case a backside blocking dielectric layer is subsequently formed, formation of the tubular dielectric spacers 116 and the planar dielectric portions is optional.

Referring to FIG. 10D, an optional backside blocking dielectric layer 44 can be formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and physically exposed sidewalls of the blocking dielectric 52 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

Figure 12:
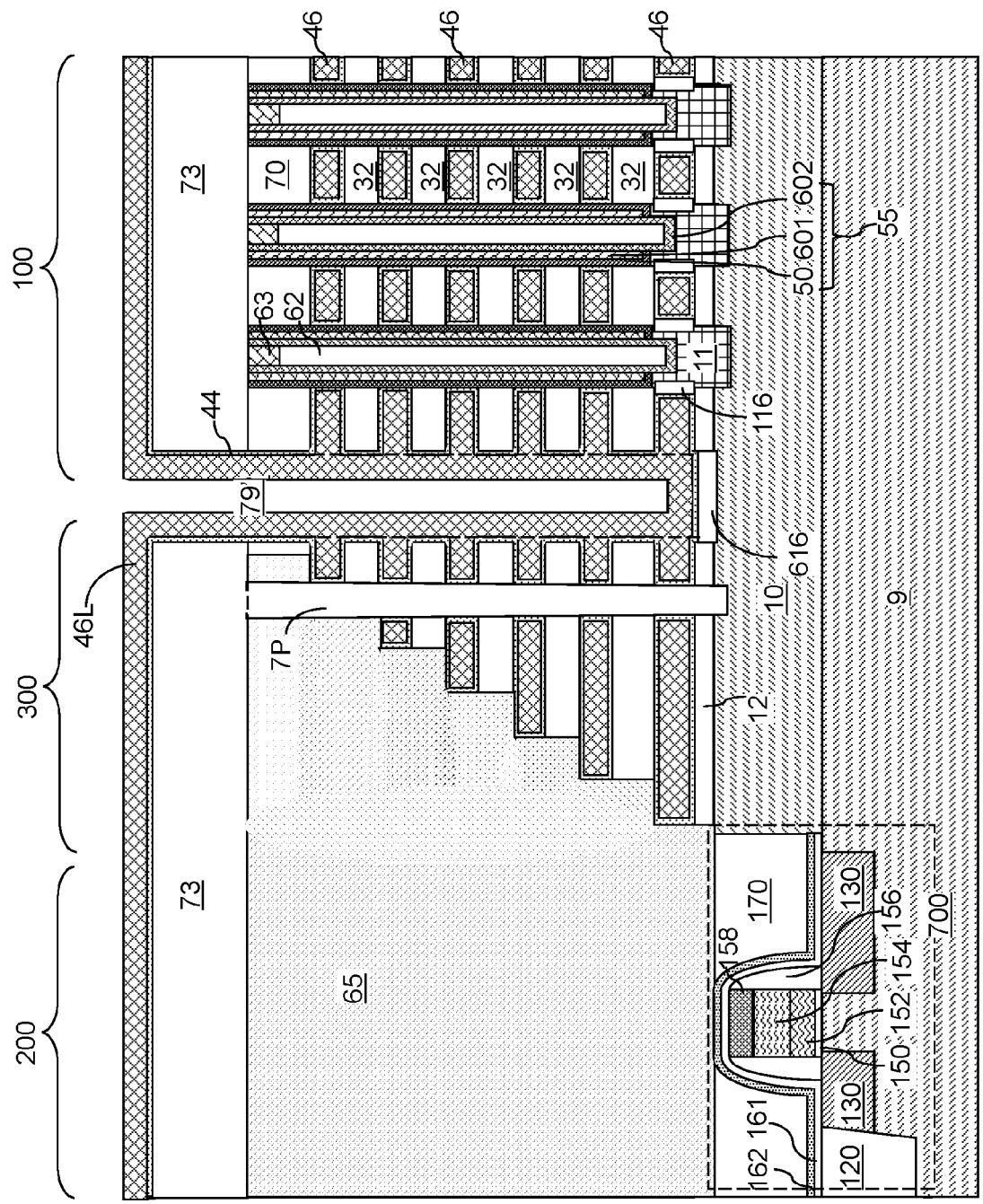
FIG. 12 is a schematic vertical cross-sectional view of the exemplary structure after formation of the electrically conductive layers and a continuous metallic material layer according to an embodiment of the present disclosure.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside trench 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer, as shown in FIG. 12.

At least one conducive material layer (462, 464) can be deposited to form electrically conductive layers 46. For example, a metallic liner 462 can be deposited directly on the surfaces of the backside blocking dielectric layer 44. The metallic liner 462 includes a metallic nitride material such as TiN, TaN, WN, an alloy thereof, or a stack thereof. The metallic liner 462 functions as a diffusion barrier layer and an adhesion promotion layer. The metallic liner 462 can have a thickness in a range from 1 nm to 6 nm (such as from 1 nm to 3 nm), although lesser and greater thicknesses can also be employed. Generally, the resistivity of a metallic nitride material is greater than the resistivity of pure metals such as W, Cu, Al, Co, Au, etc. The thickness of the metallic liner 462 is limited due to the finite height of the backside recesses 43 and the need to provide a high conductive material (such as an elemental metal or an intermetallic alloy) within a predominant volume of each backside recess 43 to provide a low conductivity conductive structure.

The metallic liner 462 can be deposited by a conformal deposition method such as chemical vapor deposition (CVD) or atomic layer deposition (ALD). The metallic liner 462 can be deposited as a continuous material layer overlying sidewalls of the memory stack structures 55 and contacting vertical and horizontal sidewalls of the backside blocking dielectric layer 44 in the backside recesses 43 and in each backside trench 79 and overlying the contact level dielectric layer 73. In case the optional backside blocking dielectric layer 44 is not employed, the continuous metallic nitride layer 462 can be deposited directly on sidewalls of the memory stack structures 55, horizontal surfaces and sidewalls of the insulating layer 32, on the top surface of each tubular dielectric spacer 116 and each planar dielectric portion 616, and the top surface of the contact level dielectric layer 73. A backside cavity 79' is present within each backside trench 79.

Subsequently, a conductive fill material layer 464 can be deposited directly on the metallic liner 462 by a conformal deposition method such as chemical vapor deposition or atomic layer deposition. The conductive fill material layer 464 includes a conductive material. The conductive material can include at least one elemental metal such as W, Cu, Co, Mo, Ru, Au, and Ag. Additionally or alternatively, the conductive fill material layer 464 can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer 464 can consist essentially of W, Co, Mo, or Ru. In one embodiment, the conductive fill material layer 464 can consist essentially of a metal selected from elemental tungsten, elemental molybdenum, elemental cobalt, elemental copper, elemental ruthenium, and an intermetallic alloy thereof.

Each portion of the at least one conducive material layer (462, 464) that fills a backside recess 43 constitutes an electrically conductive layer 46. Each electrically conductive layer 46 located above the horizontal plane including the top surface of the epitaxial channel portion 11 can include a uniform thickness portion 466 and a ridged end portion 468. The uniform thickness portion 466 is formed within a uniform height portion 432 of a backside recess 43. The ridged end portion 468 is formed within a vertically expanded end portion 434 of a backside recess 43.

As used herein, a "ridge" refers to a structure including two surfaces that protrude out of a two-dimensional reference plane and forming a cusp that extends along a direction substantially parallel to the two-dimensional reference plane. As used herein, a "ridged portion" refers to a portion that includes a ridge. As used herein, a "ridged end portion" refers to an end portion that includes a ridge. As used herein, an "annular ridge" refers to a ridge that the cusp of the ridge forms a closed shape with a single hole therein (such as a circle, an ellipse, a rectangle, or a polygon with a single hole). Each ridged end portion 468 of the electrically conductive layers 46 can include an annular ridge that laterally surrounds a respective memory stack structure 55. In case a plurality of memory stack structures 55 is present in the exemplary structure, each electrically conductive layer 46 can include as many annular ridges as the number of memory stack structures 55 that the electrically conductive layer 46 encloses.

The uniform thickness portion 466 is located farther away from the vertical semiconductor channel 60 in the memory stack structure 55 than the ridged end portion 468 of the same electrically conductive layer 46. The uniform thickness portion 466 is located farther away from the tunneling dielectric 56 than a vertical plane including an outermost sidewall of the blocking dielectric 52, which includes the interfaces between the insulating layers 32 and the blocking dielectric 52. The ridged end portion 468 is more proximal to the vertical semiconductor channel 60 of the most proximate memory stack structure 55 than the vertical plane is to the most proximate memory stack structure 55. The ridged end portion 468 and includes an upper ridge that protrudes above a first horizontal plane including a top surface of the uniform thickness portion 466 and a lower ridge that protrudes below a second horizontal plane including a bottom surface of the uniform thickness portion 466. In other words, the electrically conductive layer 46 (e.g., a word line/control gate electrode) has a sideways "T" or nail shape, with the stem portion of the "T" or nail shaped control gate electrode extends horizontally between the insulating layers 32, and the head of the "T" or nail shaped control gate electrode extends between the insulating layers 32 and the memory stack structure 55. The head portion of the control gate electrode is located closer to the vertical semiconductor channel 60 of the memory stack structure 55 than the stem portion of the control gate electrode.

For the case of the second embodiment in which the memory stack structures 55 illustrated in FIG. 6H is present in each memory opening 49 in the structure illustrated in FIGS. 8A and 8B, FIGS. 11A-11B illustrate processing steps of the second embodiment that can be employed to remove the sacrificial material layers 42 to form backside recesses 43.

Referring to FIG. 11A, a memory opening including a memory stack structure 55 is shown, which is a region of the exemplary structure illustrated in FIGS. 8A and 8B prior to removal of the sacrificial material layers 42.

Referring to FIG. 11B, the backside recesses 43 are formed by removing the sacrificial material layers 42 and surface portions of the blocking dielectric 52. The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Due to the nitrogen contents therein, the first blocking dielectric material portions 522 and the silicon oxynitride layer 624 provide less selectivity (i.e., higher etch resistance) to the etchant (e.g., hot phosphoric acid) that removes the silicon nitride material of the sacrificial material layers 42 than the insulating layers 32 that include silicon oxide and are substantially free of nitrogen. In one embodiment, the etch rate of the first blocking dielectric material portions 522 and the silicon oxynitride layer 624 can be in a range from 3% to 30% of the etch rate of the silicon nitride material of the sacrificial material layers 42, and can be in a range from 3 times the etch rate of the silicon oxide of the insulating layers 32 to 100 times the etch rate of the silicon oxide of the insulating layers 32. Thus, collateral etch of the surface portions of the first blocking dielectric material portions 522 and the silicon oxynitride layer 624 at a terminal portion of the etch process as the etchant slowly etches physically exposed portions of the first blocking dielectric material portions 522 and the silicon oxynitride layer 624. In other words, after removal of the silicon nitride layers (as embodied as the sacrificial material layers 42), physically exposed surfaces regions of the first and second blocking dielectric material portions (522, 624) are removed at the terminal portion of the etch process.

The etching of the physically exposed surface regions of the silicon oxynitride portions (i.e., the first and second blocking dielectric material portions (522, 624)) forms a recessed surface on the remaining continuous portion of the blocking dielectric 52 at each level of the sacrificial material layers 42. Each recessed surface can include a substantially vertical sidewall portion 441, an upper concave sidewall portion 442 adjoined to an upper end of the substantially vertical sidewall portion 441, and a lower concave sidewall portion 443 adjoined to a lower end of the substantially vertical sidewall portion 441.

Each backside recess 43 includes a vertically expanded end portion 434 that is more proximal to a most proximate memory stack structure 55 than a substantially vertical interface between the most proximate memory stack structure 55 and the insulating layers 32 is to the most proximate memory stack structure 55.

Each backside recess 43 further includes a uniform height portion 432 that is more distal from the most proximate memory stack structure 55 than the substantially vertical interface between the most proximate memory stack structure 55 and the insulating layers 32 is to the most proximate memory stack structure 55. Each uniform height portion 432 of the plurality of backside recesses 43 can extend substantially parallel to the top surface of the substrate (9, 10). The uniform height portion 432 of the backside recesses 43 can be vertically bounded by a top surface of an underlying insulating layer 32 and a bottom surface of an overlying insulating layer 32. In one embodiment, the uniform height portion 432 of each backside recess 43 can have a uniform height throughout.

Referring to FIG. 11C, physically exposed surface portions of the optional epitaxial channel portions 11 and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616 (shown in FIG. 13). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. The oxygen concentration in the first and second blocking dielectric material portions (522, 624) may increase during the oxidation process. In case a backside blocking dielectric layer is subsequently formed, formation of the tubular dielectric spacers 116 and the planar dielectric portions is optional.

Referring to FIG. 11D, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and physically exposed sidewalls of the blocking dielectric 52 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside trench 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conducive material layer (462, 464) can be deposited to form electrically conductive layers 46. For example, a metallic liner 462 can be deposited directly on the surfaces of the backside blocking dielectric layer 44. The metallic liner 462 includes a metallic nitride material such as TiN, TaN, WN, an alloy thereof, or a stack thereof. The metallic liner 462 functions as a diffusion barrier layer and an adhesion promotion layer. The metallic liner 462 can have a thickness in a range from 1 nm to 6 nm (such as from 1 nm to 3 nm), although lesser and greater thicknesses can also be employed. Generally, the resistivity of a metallic nitride material is greater than the resistivity of pure metals such as W, Cu, Al, Co, Au, etc. The thickness of the metallic liner 462 is limited due to the finite height of the backside recesses 43 and the need to provide a high conductive material (such as an elemental metal or an intermetallic alloy) within a predominant volume of each backside recess 43 to provide a low conductivity conductive structure.

The metallic liner 462 can be deposited by a conformal deposition method such as chemical vapor deposition (CVD) or atomic layer deposition (ALD). The metallic liner 462 can be deposited as a continuous material layer overlying sidewalls of the memory stack structures 55 and contacting vertical and horizontal sidewalls of the backside blocking dielectric layer 44 in the backside recesses 43 and in each backside trench 79 and overlying the contact level dielectric layer 73. In case the optional backside blocking dielectric layer 44 is not employed, the continuous metallic nitride layer 462 can be deposited directly on sidewalls of the memory stack structures 55, horizontal surfaces and sidewalls of the insulating layer 32, on the top surface of each tubular dielectric spacer 116 and each planar dielectric portion 616, and the top surface of the contact level dielectric layer 73. A backside cavity 79' is present within each backside trench 79.

Subsequently, a conductive fill material layer 464 can be deposited directly on the metallic liner 462 by a conformal deposition method such as chemical vapor deposition or atomic layer deposition. The conductive fill material layer 464 includes a conductive material. The conductive material can include at least one elemental metal such as W, Cu, Co, Mo, Ru, Au, and Ag. Additionally or alternatively, the conductive fill material layer 464 can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer 464 can consist essentially of W, Co, Mo, or Ru. In one embodiment, the conductive fill material layer 464 can consist essentially of a metal selected from elemental tungsten, elemental molybdenum, elemental cobalt, elemental copper, elemental ruthenium, and an intermetallic alloy thereof.

Each portion of the at least one conducive material layer (462, 464) that fills a backside recess 43 constitutes an electrically conductive layer 46. Each electrically conductive layer 46 located above the horizontal plane including the top surface of the epitaxial channel portion 11 can include a uniform thickness portion 466 and a ridged end portion 468. The uniform thickness portion 466 is formed within a uniform height portion 432 of a backside recess 43. The ridged end portion 468 is formed within a vertically expanded end portion 434 of a backside recess 43.

Each ridged end portion 468 of the electrically conductive layers 46 can include an annular ridge that laterally surrounds a respective memory stack structure 55. In case a plurality of memory stack structures 55 is present in the exemplary structure, each electrically conductive layer 46 can include as many annular ridges as the number of memory stack structures 55 that the electrically conductive layer 46 encloses.

The uniform thickness portion 466 is located farther away from the vertical semiconductor channel 60 in the memory stack structure 55 than the ridged end portion 468 of the same electrically conductive layer 46. The uniform thickness portion 466 is located farther away from the tunneling dielectric 56 than a vertical plane including an outermost sidewall of the blocking dielectric 52, which includes the interfaces between the insulating layers 32 and the blocking dielectric 52. The ridged end portion 468 is more proximal to the vertical semiconductor channel 60 of the most proximate memory stack structure 55 than the vertical plane is to the most proximate memory stack structure 55. The ridged end portion 468 and includes an upper ridge that protrudes above a first horizontal plane including a top surface of the uniform thickness portion 466 and a lower ridge that protrudes below a second horizontal plane including a bottom surface of the uniform thickness portion 466. In other words, the electrically conductive layer 46 (e.g., a word line/control gate electrode) has a sideways "T" or nail shape, with the stem portion of the "T" or nail shaped control gate electrode extends horizontally between the insulating layers 32, and the head of the "T" or nail shaped control gate electrode extends between the insulating layers 32 and the memory stack structure 55. The head portion of the control gate electrode is located closer to the vertical semiconductor channel 60 of the memory stack structure 55 than the stem portion of the control gate electrode.

Referring to FIG. 12, the exemplary structure incorporating the electrically conductive layers 46 illustrated in FIG. 10D or FIG. 11D is illustrated. Each portion of the at least one conductive material layer (462, 464) located in a backside recess constitutes an electrically conductive layer 46. The portion of the at least one conductive material layer (462, 464) that exclude the electrically conductive layers 46 constitutes continuous metallic material layer 46L. A plurality of electrically conductive layers 46 can be formed in the plurality of backside recesses 43, and the continuous metallic material layer 46L can be formed on the sidewalls of each backside trench 79 and over the contact level dielectric layer 73. Thus, each sacrificial material layer 42 can be replaced with an electrically conductive layer 46. A backside cavity 79' is present in the portion of each backside trench 79 that is not filled with the backside blocking dielectric layer and the continuous metallic material layer 46L. A tubular dielectric spacer 116 laterally surrounds a respective epitaxial channel portion 11. An electrically conductive layer 46 (such as the bottommost electrically conductive layer 46 which may comprise a source side select gate electrode) laterally surrounds each tubular dielectric spacer 116 upon formation of the electrically conductive layers 46.

Figure 13:
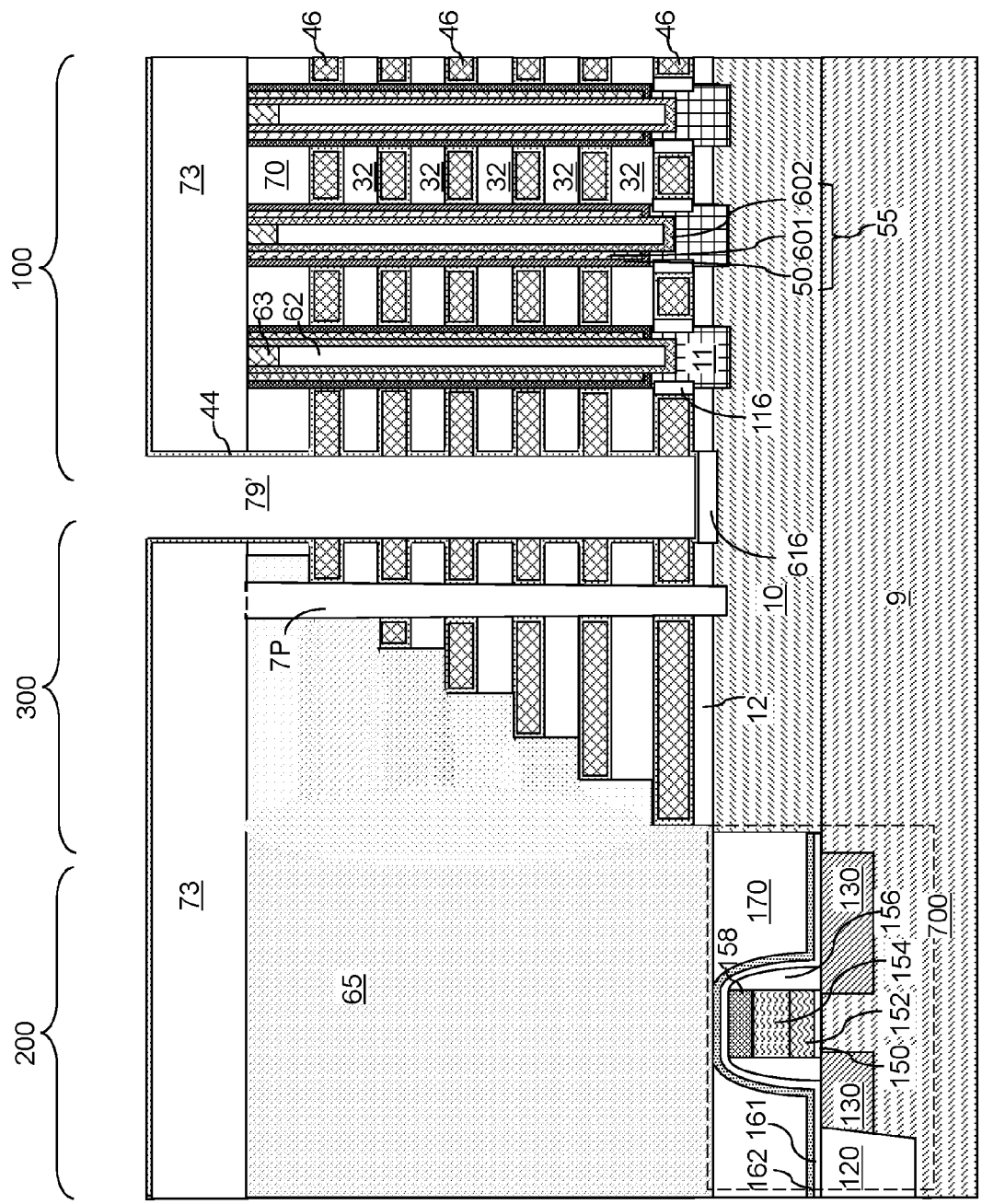
FIG. 13 is a schematic vertical cross-sectional view of the exemplary structure after removal of a deposited conductive material from within the backside trench according to an embodiment of the present disclosure.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. The electrically conductive layers 46 in the backside recesses are not removed by the etch process. In one embodiment, the sidewalls of each electrically conductive layer 46 can be vertically coincident after removal of the continuous electrically conductive material layer 46L.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 14:
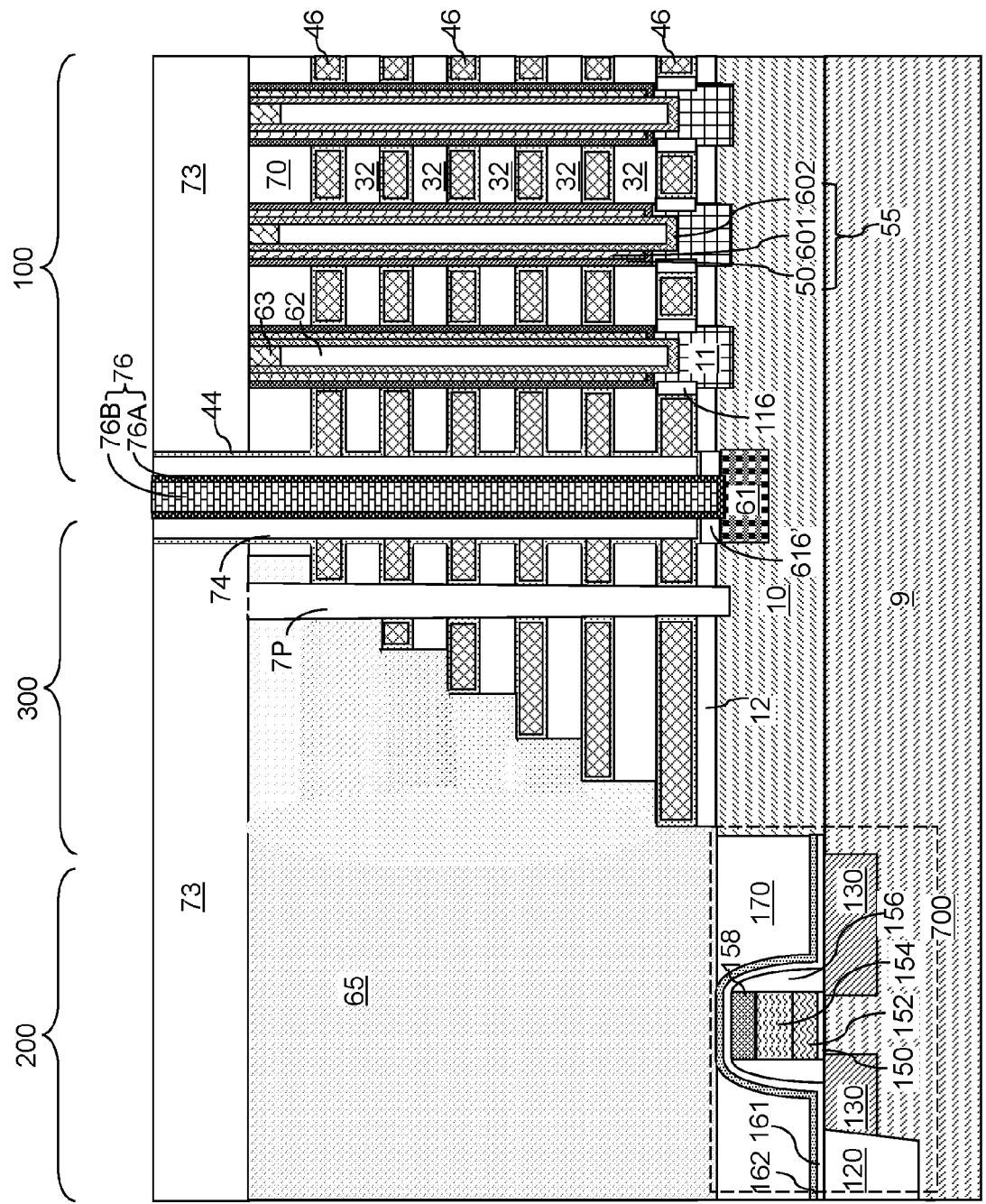
FIG. 14 is a schematic vertical cross-sectional view of the exemplary structure after formation of an insulating spacer and a backside contact structure according to an embodiment of the present disclosure.

Referring to FIG. 14, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 73 and at the bottom of each backside trench 79. Each remaining portion of the insulating material layer constitutes an insulating spacer 74. The anisotropic etch can continue to etch through physically exposed portions of the planar dielectric portion 616 in each backside trench 79. Each remaining portion of the planar dielectric portion 616 is herein referred to as an annular insulating spacer 616'. Thus, an insulating spacer 74 is formed in each backside trench 79 directly on physically exposed sidewalls of the electrically conductive layers 46.

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A backside contact via structure 76 can be formed within each cavity 79'. Each contact via structure 76 can fill a respective cavity 79'. The backside contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Figure 15:
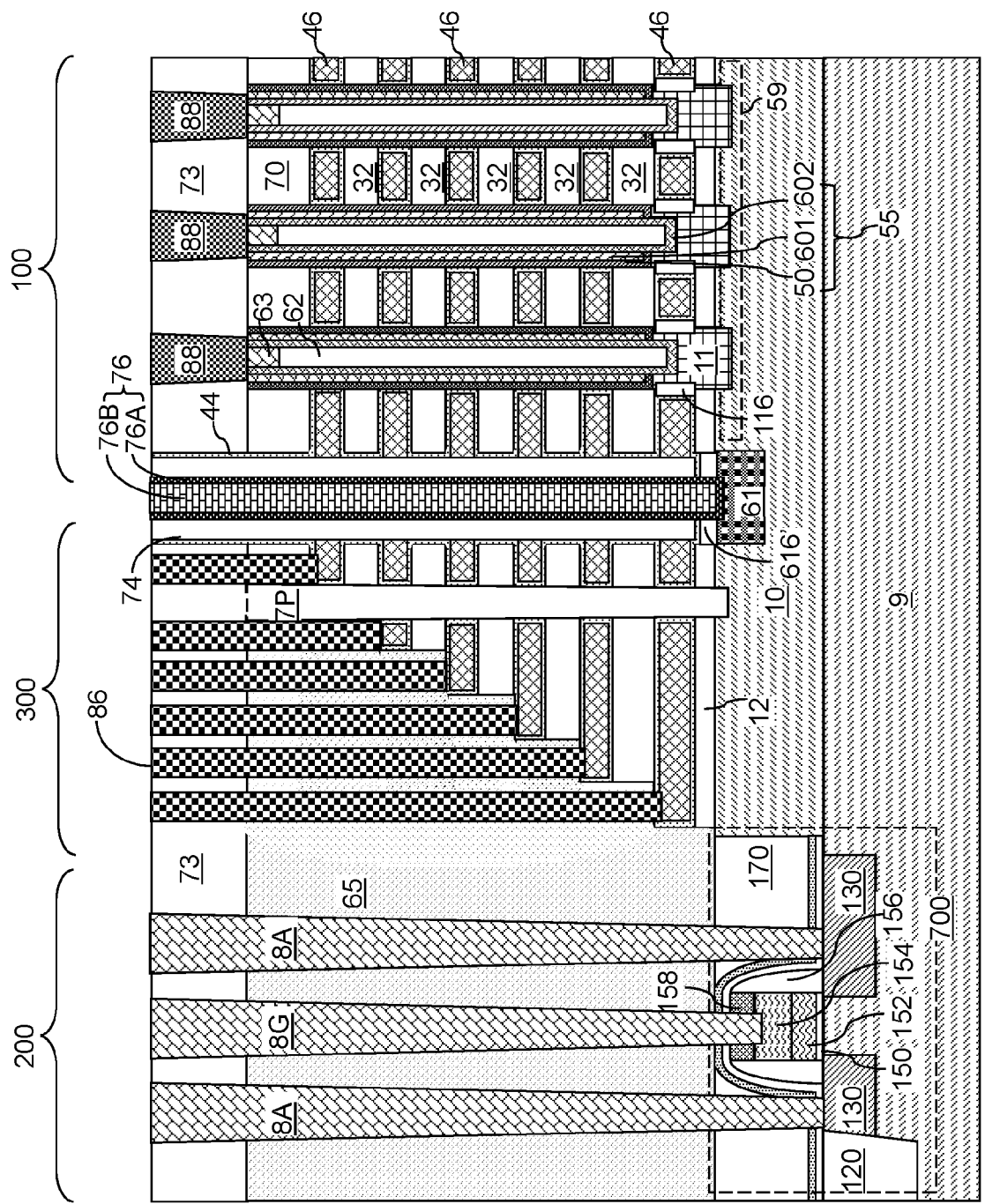
FIG. 15 is a schematic vertical cross-sectional view of the exemplary structure after formation of additional contact via structures according to an embodiment of the present disclosure.

Referring to FIG. 15, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices.

Referring collectively to FIGS. 10B, 10D, 11B, 11D, and 15, the exemplary structure of the present disclosure can include a three-dimensional memory device. The three-dimensional memory device includes an alternating stack of insulating layers 32 and electrically conductive layers 46 located over a substrate (9, 10); a memory stack structure 55 extending through the alternating stack (32, 46) and comprising a blocking dielectric 52, a charge storage layer 54, a tunneling dielectric 56, and a vertical semiconductor channel 60. Each electrically conductive layer 46 within a subset of the electrically conductive layers 46 comprises control gate electrode having a uniform thickness portion 466 and a ridged end portion 468. The subset of the electrically conductive layers 46 can include all electrically conductive layers 46 located above a horizontal plane including the top surface of an epitaxial channel portion 11 located under the memory stack structure 55. The select gate electrodes may have the shame shape as the control gate electrodes and may be located below and above the control gate electrodes. The uniform thickness portion 466 is located farther away from the vertical semiconductor channel 60 than the ridged end portion 468. The ridged end portion 468 includes an upper ridge that protrudes above a first horizontal plane including a top surface of the uniform thickness portion 466 and a lower ridge that protrudes below a second horizontal plane including a bottom surface of the uniform thickness portion 466.

In one embodiment, the blocking dielectric 52 has a greater thickness at levels of the insulating layers 32 than at levels of the subset of the electrically conductive layers 46 that are located above the horizontal plane including the top surface of the epitaxial channel portion 55. In one embodiment, the blocking dielectric 52 comprises first blocking dielectric material portions 522 having a first material composition and contacting sidewalls of the insulating layers 32 and not located at the levels of the electrically conductive layers 46; and at least one second blocking dielectric material portion (524/624) having a second material composition and located at least at levels of the subset of the electrically conductive layers 46.

In one embodiment, inner sidewalls of the first blocking dielectric material portions 522 are vertically coincident with inner sidewalls of the second blocking dielectric material portions 524. In one embodiment, the at least one second blocking dielectric material portion 524 can be a plurality of second blocking dielectric material portions 524. The plurality of second blocking dielectric material portions 524 can be provided as discrete annular dielectric material portions that are vertically spaced from one another.

In one embodiment, inner sidewalls of the first blocking dielectric material portions 522 contact outer sidewalls of the at least one second blocking dielectric material portion 624. In one embodiment, the at least one second blocking dielectric material portion 624 can be a single continuous material portion that vertically extends from a bottommost electrically conductive layer 46 within the subset to a topmost electrically conductive layer 46 within the subset.

In one embodiment, the first blocking dielectric material portions 522 comprise a first silicon oxynitride including a first average atomic concentration of nitrogen atoms, the at least one second blocking dielectric material portion (524, 624) comprises a second silicon oxynitride including a second average atomic concentration of nitrogen atoms, and the second average atomic concentration of nitrogen atoms is different from the first average atomic concentration of nitrogen atoms.

In one embodiment, an element selected from an additional blocking dielectric material layer (such as a front side blocking dielectric layer 526) and the charge storage layer 54 physically contacts inner sidewalls of the at least one second blocking dielectric material portion (524, 624).

In one embodiment, the blocking dielectric 52 comprises a recessed surface (441, 442, 443) at each level of the subset of the electrically conductive layers 46 located above the horizontal plane including the top surface of the memory stack structure 55. The recessed surface (441, 442, 443) can include a substantially vertical sidewall portion 441, an upper concave sidewall portion 442 adjoined to an upper end of the substantially vertical sidewall portion 441, and a lower concave sidewall portion 443 adjoined to a lower end of the substantially vertical sidewall portion 441. In one embodiment, an element selected from a backside blocking dielectric layer 44 and a metallic liner 462 (in case the backside blocking dielectric layer 44 is omitted) within a respective electrically conductive layer 46 is in physical contact with each recessed surface (441, 442, 443) of the blocking dielectric 52.

In one embodiment, the three-dimensional memory device can further include an epitaxial channel portion 11 located underneath the memory stack structure 55 and electrically shorted to the vertical semiconductor channel 60, and a tubular dielectric spacer 116 laterally surrounding the epitaxial channel portion 11. In one embodiment, one of the electrically conductive layers 46 that do not belong to the subset of the electrically conductive layers 46 (e.g., a bottommost electrically conductive layer 46, such as the source side select gate electrode) is located at a same level as the tubular dielectric spacer 116, and does not include any ridged portion that protrudes above a horizontal top surface of the one of the electrically conductive layers 46 or below a horizontal bottom surface of the one of the electrically conductive layers 46. In other words, the electrically conductive layer 46 that is located at a level of the epitaxial channel portion 11 can be free of any ridges, and can have the same vertical height throughout.

In one embodiment, the three-dimensional memory device further includes a backside trench 79 extending through the alternating stack (32, 46); an insulating spacer 74 located at a periphery of the backside trench 79 and contacting sidewalls of the electrically conductive layers 46; a source region 61 located in an upper portion of the substrate (9, 10) and underlying the backside trench 79; and a backside contact via structure 76 contacting the source region 61 and laterally surrounded by the insulating spacer 74.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). A horizontal semiconductor channel 59 can be provided within an upper portion of the semiconductor material layer 10 between the source region 61 and the epitaxial channel portions 11.

In one embodiment, the three-dimensional memory device comprises a vertical NAND device located over the substrate (9, 10); the electrically conductive layers 46 comprise, or are electrically connected to, a respective word line of the NAND device; the substrate (9, 10) comprises a silicon substrate; the vertical NAND device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings; and the silicon substrate contains an integrated circuit comprising a driver circuit for the memory device located thereon. The array of monolithic three-dimensional NAND strings can comprise: a plurality of semiconductor channels (60, 11, and a surface portion of the semiconductor material layer between the source region 61 and the epitaxial channel portions 11). At least one end portion of each of the plurality of semiconductor channels extends substantially perpendicular to a top surface of the substrate (9, 10). The electrically conductive layers 46 can comprise a plurality of control gate electrodes having a strip shape extending substantially parallel to the top surface of the substrate (9, 10). The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the charge storage layer 54 that are located at each level of the electrically conductive layers 46). Each charge storage element can be located adjacent to a respective one of the plurality of semiconductor channels (59, 11, 60).

Formation of a bird's beak in a blocking dielectric (which cannot be avoided in many prior art schemes) that results in shortening of gate length can be avoided by the methods of the present disclosure. Further, the exemplary structure of the present disclosure provides an elongate gate length by extending the vertical extent of the electrically conductive layers 46 that function as control gate electrodes beyond the physical thickness of the uniform thickness portion 466 of each electrically conductive layer 46. Extension of the gate length for the control gate electrodes can enhance the control of the electrical field by the control gate electrodes, and can reduce the leakage current between vertically neighboring levels.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate; and
   a memory stack structure extending through the alternating stack and comprising a blocking dielectric, a charge storage layer, a tunneling dielectric, and a vertical semiconductor channel,
   wherein:
   each electrically conductive layer within a subset of the electrically conductive layers comprises a control gate electrode having a uniform thickness portion and a ridged end portion;
   the uniform thickness portion is located farther away from the vertical semiconductor channel than the ridged end portion;
   the ridged end portion comprises an upper ridge that protrudes above a first horizontal plane including a top surface of the uniform thickness portion and a lower ridge that protrudes below a second horizontal plane including a bottom surface of the uniform thickness portion; and wherein the blocking dielectric has a greater thickness at levels of the insulating layers than at levels of the subset of the electrically conductive layers.

2. The three-dimensional memory device of claim 1, wherein the blocking dielectric comprises:
   first blocking dielectric material portions having a first material composition and contacting sidewalls of the insulating layers and not located at the levels of the electrically conductive layers; and
   at least one second blocking dielectric material portion having a second material composition and located at least at levels of the subset of the electrically conductive layers.

3. The three-dimensional memory device of claim 2, wherein inner sidewalls of the first blocking dielectric material portions are vertically coincident with inner sidewalls of the at least one second blocking dielectric material portion.

4. The three-dimensional memory device of claim 2, wherein the at least one second blocking dielectric material portion is provided as discrete annular dielectric material portions that are vertically spaced from one another.

5. The three-dimensional memory device of claim 2, wherein inner sidewalls of the first blocking dielectric material portions contact outer sidewalls of the at least one second blocking dielectric material portion.

6. The three-dimensional memory device of claim 2, wherein the at least one second blocking dielectric material portion is a single continuous material portion that vertically extends from a bottommost electrically conductive layer within the subset of the electrically conductive layers to a topmost electrically conductive layer within the subset of the electrically conductive layers.

7. The three-dimensional memory device of claim 2, wherein:
   the first blocking dielectric material portions comprise a first silicon oxynitride including a first average atomic concentration of nitrogen atoms;
   the at least one second blocking dielectric material portion comprises a second silicon oxynitride including a second average atomic concentration of nitrogen atoms; and
   the second average atomic concentration of nitrogen atoms is different from the first average atomic concentration of nitrogen atoms.

8. The three-dimensional memory device of claim 1, wherein an element selected from an additional blocking dielectric material layer and the charge storage layer physically contacts inner sidewalls of the at least one second blocking dielectric material portion.

9. The three-dimensional memory device of claim 1, wherein:
   the blocking dielectric comprises a recessed surface at each level of the subset of the electrically conductive layers; and
   the recessed surface comprises a substantially vertical sidewall portion, an upper concave sidewall portion adjoined to an upper end of the substantially vertical sidewall portion, and a lower concave sidewall portion adjoined to a lower end of the substantially vertical sidewall portion.

10. A three-dimensional memory device comprising:
    an alternating stack of insulating layers and electrically conductive layers located over a substrate; and
    a memory stack structure extending through the alternating stack and comprising a blocking dielectric, a charge storage layer, a tunneling dielectric, and a vertical semiconductor channel,
    wherein:
    each electrically conductive layer within a subset of the electrically conductive layers comprises a control gate electrode having a uniform thickness portion and a ridged end portion;
    the uniform thickness portion is located farther away from the vertical semiconductor channel than the ridged end portion;
    the ridged end portion comprises an upper ridge that protrudes above a first horizontal plane including a top surface of the uniform thickness portion and a lower ridge that protrudes below a second horizontal plane including a bottom surface of the uniform thickness portion;
    wherein the blocking dielectric has a greater thickness at levels of the insulating layers than at levels of the subset of the electrically conductive layers;
    wherein:
    the blocking dielectric comprises a recessed surface at each level of the subset of the electrically conductive layers; and
    the recessed surface comprises a substantially vertical sidewall portion, an upper concave sidewall portion adjoined to an upper end of the substantially vertical sidewall portion, and a lower concave sidewall portion adjoined to a lower end of the substantially vertical sidewall portion;
    wherein an element selected from a backside blocking dielectric layer and a metallic liner within a respective electrically conductive layer is in physical contact with each recessed surface of the blocking dielectric.

11. The three-dimensional memory device of claim 1, further comprising:
    an epitaxial channel portion located underneath the memory stack structure and electrically shorted to the vertical semiconductor channel; and
    a tubular dielectric spacer laterally surrounding the epitaxial channel portion,
    wherein one of the electrically conductive layers that do not belong to the subset of the electrically conductive layers is located at a same level as the tubular dielectric spacer and does not include any ridged portion that protrudes above a horizontal top surface of the one of the electrically conductive layers or below a horizontal bottom surface of the one of the electrically conductive layers.

12. The three-dimensional memory device of claim 1, further comprising:
    a backside trench extending through the alternating stack;
    an insulating spacer located at a periphery of the backside trench and contacting sidewalls of the electrically conductive layers;
    a source region located in an upper portion of the substrate and underlying the backside trench; and
    a backside contact via structure contacting the source region and laterally surrounded by the insulating spacer.

13. The three-dimensional memory device of claim 1, wherein the alternating stack comprises a terrace region in which each electrically conductive layer other than a topmost electrically conductive layer within the alternating stack laterally extends farther than any overlying electrically conductive layer within the alternating stack, and the terrace region includes stepped surfaces of the alternating stack that continuously extend from a bottommost layer within the alternating stack to a topmost layer within the alternating stack.

14. The three-dimensional memory device of claim 1, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate;

the plurality of control gate electrodes comprises at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate; and a plurality of charge storage elements, each charge storage element located adjacent to a respective one of the plurality of semiconductor channels.

* * * * *